US012730002B2

(12) United States Patent
Myhrvold et al.

(10) Patent No.: US 12,730,002 B2
(45) Date of Patent: Sep. 8, 2026

(54) QUANTUM-ENGINEERED SUPERCONDUCTOR METAMATERIAL DEVICES

(71) Applicant: Enterprise Science Fund, LLC, Bellevue, WA (US)

(72) Inventors: Nathan P. Myhrvold, Bellevue, WA (US); Brian C. Holloway, Snoqualmie, WA (US); Stuart A. Wolf, Bowie, MD (US); Rohit P. Prasankumar, Albuquerque, NM (US); Christoph Heil, Graz (AT)

(73) Assignee: Enterprise Science Fund, LLC, Bellevue, WA (US)

( * ) Notice: Subject to any disclaimer, the term of this patent is extended or adjusted under 35 U.S.C. 154(b) by 272 days.

(21) Appl. No.: 18/646,508

(22) Filed: Apr. 25, 2024

(65) Prior Publication Data

US 2024/0410748 A1 Dec. 12, 2024

Related U.S. Application Data

(60) Provisional application No. 63/519,796, filed on Aug. 15, 2023, provisional application No. 63/498,351, filed on Apr. 26, 2023.

(51) Int. Cl.

| | |
|---|---|
| ***G01J 1/44*** | (2006.01) |
| ***B82Y 15/00*** | (2011.01) |
| ***H10N 60/30*** | (2023.01) |
| ***H10N 60/84*** | (2023.01) |
| ***H10N 60/85*** | (2023.01) |

(52) U.S. Cl.

CPC ................ *G01J 1/44* (2013.01); *B82Y 15/00* (2013.01); *H10N 60/30* (2023.02); *H10N 60/84* (2023.02); *H10N 60/85* (2023.02); *G01J 2001/442* (2013.01)

(58) Field of Classification Search

CPC ...... G01J 1/44; G01J 2001/442; H10N 60/84; H10N 60/85; B82Y 15/00

See application file for complete search history.

(56) References Cited

U.S. PATENT DOCUMENTS

| | | | |
|---|---|---|---|
| 11,424,400 | B1 | 8/2022 | El-Kady et al. |
| 2016/0093420 | A1 | 3/2016 | Urzhumov |

(Continued)

OTHER PUBLICATIONS

Allan, M. P., Fischer, M. H., Ostojic, O. & Andringa, A. Creating better superconductors by periodic nanopatterning. *SciPost Physics* 3, (2017).

(Continued)

*Primary Examiner* — Georgia Y Epps
*Assistant Examiner* — Don J Williams
(74) *Attorney, Agent, or Firm* — PCFB, LLC; Justin K. Flanagan

(57) ABSTRACT

According to various embodiments, a quantum-engineered superconductor metamaterial is formed with a plurality of structurally engineered superconductor nanophononic crystal nanostructures. Each superconductor nanophononic crystal nanostructure may be formed as a crystal of the superconductor material. Structural modifications are made to each superconductor nanophononic crystal nanostructure to alter a characteristic of a phonon mode of the superconducting material to enhance a superconducting parameter thereof.

35 Claims, 24 Drawing Sheets

(56) References Cited

U.S. PATENT DOCUMENTS

2020/0028063 A1 1/2020 Braeuninger-Weimer et al.
2020/0240847 A1 7/2020 Harrabi
2022/0236108 A1 7/2022 Perrenoud et al.
2022/0285603 A1 9/2022 El-Kady et al.
2023/0031577 A1* 2/2023 Gangaiah ............... H10N 60/30

OTHER PUBLICATIONS

Allmaras, J. P. Modeling and Development of Superconducting Nanowire Single-Photon Detectors. (2020).
Anant, V. et al. Optical properties of superconducting nanowire single-photon detectors. *Opt Express* 16, 10750 (2008).
Capelle, K. A bird's-eye view of density-functional theory. (2002) doi: 10.1590/S0103-97332006000700035.
Carbotte, J. P., Schachinger, E. & Basov, D. N. Coupling strength of charge carriers to spin fluctuations in high-temperature superconductors. *Nature* 401, 354-356 (1999).
Charaev, I. et al. Single-photon detection using high-temperature superconductors. *Nat Nanotechnol* (2023) doi:10.1038/s41565-023-01325-2.
Chen, H. et al. Tuning the Resonance in High-Temperature Superconducting Terahertz Metamaterials. *Physical Review Letters*, 105, 247402 (2010).
Chen, H., Taylor, A. J. & Yu, N. A review of metasurfaces : physics and applications. *Reports on Progress in Physics* 79, 76401 (2015).
Csete, M. et al. Improvement of infrared single-photon detectors absorptance by integrated plasmonic structures. *Sci Rep* 3, 2406 (2013).
Cucciniello, N. et al. Superconducting niobium nitride: A perspective from processing, microstructure, and superconducting property for single photon detectors. *Journal of Physics Condensed Matter* 34, (2022).
Cyberey, M. et al. NbTiN/AIN/NbTiN SIS junctions realized by reactive bias target ion beam deposition. *IEEE Transactions on Applied Superconductivity* 29, 1100306 (2019).
Dane, A. et al. Self-heating hotspots in superconducting nanowires cooled by phonon black-body radiation. *Nat Commun* 13, (2022).
Davis, B. L. & Hussein, M. I. Nanophononic metamaterial: Thermal conductivity reduction by local resonance. *Phys Rev Lett* 112, (2014).
Davis, B. L. & Hussein, M. I. Thermal characterization of nanoscale phononic crystals using supercell lattice dynamics. *AIP Adv* 1, 041701 (2011).
Doe Bes. *Quantum Materials for Energy Relevant Technology*. http://science.energy.gov/bes/community-resources/reports/ (2017).
Drozdov, A. P. et al. Superconductivity at 250 K in lanthanum hydride under high pressures. *Nature* 569, 528 (2019).
Ejrnaes, M. et al. Single photon detection in NbRe superconducting microstrips. *Appl Phys Lett* 121, (2022).
Engel, A. & Schilling, A. Numerical analysis of detection-mechanism models of SNSPD. (2013) doi:10.1063/1.4836878.
Engel, A., Renema, J. J., Il'In, K. & Semenov, A. Detection mechanism of superconducting nanowire single-photon detectors. *Supercond Sci Technol* 28, (2015).
Eom, B. H., Day, P. K., Leduc, H. G. & Zmuidzinas, J. A Wideband, Low-Noise Superconducting Amplifier with High Dynamic Range. *Nat Phys* (2012).
Esmaeil Zadeh, I. et al. Superconducting nanowire single-photon detectors: A perspective on evolution, state-of-the-art, future developments, and applications. *Appl Phys Lett* 118, (2021).
Frasca, S. et al. Determining the depairing current in superconducting nanowire single-photon detectors. *Phys Rev B* 100, 054520 (2019).
Giustino, F. Electron-phonon interactions from first principles. *Rev Mod Phys* 89, 1-63 (2017).
Hussein, M. I., Leamy, M. J. & Ruzzene, M. Dynamics of phononic materials and structures: Historical origins, recent progress, and future outlook. *Appl Mech Rev* 66, 040802 (2014).
Hussein, M. I., Tsai, C. N. & Honarvar, H. Thermal Conductivity Reduction in a Nanophononic Metamaterial versus a Nanophononic Crystal: A Review and Comparative Analysis. *Adv Funct Mater* 30, (2020).
Keimer, B., Kivelson, S. A., Norman, M. R., Uchida, S. & Zaanen, J. From quantum matter to high-temperature superconductivity in copper oxides. *Nature* 518, 179-186 (2015).
Kempa, K. et al. Enhancement of superconductivity via resonant anti-shielding with topological plasmon-polarons ArXiv (2021).
Kim, C. et al. Wafer-scale magnesium diboride thin films and devices with tunable high kinetic inductance. ArXiv (2023).
Kohopää, K. et al. Wafer-scale method for amorphizing superconducting thin films. ArXiv (2023).
Korzh, B. A. et al. Demonstrating sub-3 ps temporal resolution in a superconducting nanowire single-photon detector. *Nat Photonics* 14, 1-6 (2020).
Lita, A. E., Reddy, D. V., Verma, V. B., Mirin, R. P. & Nam, S. W. Development of Superconducting Single-Photon and Photon-No. Resolving Detectors for Quantum Applications. *Journal of Lightwave Technology* 40, 7578-7597 (2022).
Maldovan, M. Phonon wave interference and thermal bandgap materials. *Nat Mater* 14, 667-674 (2015).
Morozov, D. V., Casaburi, A. & Hadfield, R. H. Superconducting photon detectors. *Contemp Phys* 62, 69-91 (2021).
Natarajan, C. M., Tanner, M. G. & Hadfield, R. H. Superconducting nanowire single-photon detectors: physics and applications. ArXiv (2012).
Nieto, S. J. R., Hofer, J. A., Sirena, M. & Haberkorn, N. Flexible NbTiN thin films for superconducting electronics. *Physica C: Superconductivity and its Applications* 607, 1354241 (2023).
Nomura, Y. & Akashi, R. Density functional theory. ArXiv (2022).
Pickard, C. J. Ephemeral data derived potentials for random structure search. *Phys Rev B* 106, 014102 (2022).
Pickett, W. E. Room Temperature Superconductivity: the Roles of Theory and Materials Design. *Rev Mod Phys* (2022).
Pickett, W. E. Room temperature superconductivity: The roles of theory and materials design. *Rev Mod Phys* 95, 021001 (2023).
Protte, M. et al. Laser-lithographically written micron-wide superconducting nanowire single-photon detectors. *Supercond Sci Technol* 35, (2022).
Semenov, A. D. Superconducting nanostrip single-photon detectors some fundamental aspects in detection mechanism, technology and performance. *Supercond Sci Technol* 34, (2021).
Si, Q. & Hussey, N. E. Iron-based superconductors: Teenage, complex, challenging. *Phys Today* 76, 34 (2023).
Smolyaninov, Igor. & Smolyaninova, V. N. Metamaterial superconductors. *Phys. Rev. B* 91, 094501 (2015).
Smolyaninova, Igor & Smolyaninova , V. Metamaterial superconductors. *De Gruyter* Nanophotonics 2018; 7(5): 795-818 (2018).
Smolyaninova, V. et al. Effect of metamaterial engineering on the superconductive properties of ultrathin layers of NbTiN. *J. Appl. Phys*. 130, 073901 (2021).
Smolyaninova, V. et al. Using metamaterial nanoengineering to triple the superconducting critical temperature of bulk aluminum. *Scientific Reports* (2015).
Spann, B. T. et al. Semiconductor Thermal and Electrical Properties Decoupled by Localized Phonon Resonances. *Advanced Materials* (2023) doi:10.1002/adma.202209779.
Sunter, K. A. & Berggren, K. K. Optical modeling of superconducting nanowire single photon detectors using the transfer matrix method. *Appl Opt* 57, 4872 (2018).
Vasileiadis, T. et al. Progress and perspectives on phononic crystals. *Journal of Applied Physics* vol. 129 160901 Preprint at (2021).
Vodolazov, D. Yu. Minimal timing jitter in superconducting nanowire single photon detectors. *Phys Rev Appl* (2019) doi:10.1103/PhysRevApplied.11.014016.
Vodolazov, D. Yu. Theory of single photon detection by 'dirty' current-carrying superconducting strip based on the kinetic equation approach. *Phys Rev Appl* (2017) doi: 10.1103/PhysRevApplied.7.034014.
Wei, X. et al. Ultrathin epitaxial NbN superconducting films with high upper critical field grown at low temperature. *Mater Res Lett* 9, 336-342 (2021).

(56) References Cited

OTHER PUBLICATIONS

Yang, J. K. W. et al. Modeling the electrical and thermal response of superconducting nanowire single-photon detectors. in *IEEE Transactions on Applied Superconductivity* vol. 17 581-585 (2007).
You, L. Superconducting nanowire single-photon detectors for quantum information. *Nanophotonics* 9, 2673-2692 (2020).
Zichi, J. et al. Optimizing the stoichiometry of ultrathin NbTIN films for high-performance superconducting nanowire single-photon detectors. *Opt Express* 27, 26579 (2019).
International Search Report for App. No. PCT/US2024/026387 mailed Sep. 19, 2025.
Written Opinion for App. No. PCT/US2024/026387 mailed Sep. 19, 2025.

* cited by examiner

QUANTUM-ENGINEERED SUPERCONDUCTOR METAMATERIAL DEVICES

CROSS-REFERENCE TO RELATED APPLICATIONS

This application claims the benefit of and priority to U.S. Provisional Patent Application No. 63/498,351 filed on Apr. 26, 2023, entitled "Enhancing Superconducting Critical Temperatures with Phononic Crystals," and U.S. Provisional Patent Application No. 63/519,796 filed on Aug. 15, 2023, entitled "Superconducting Quantum Metamaterial Enhanced Devices," each of which is hereby incorporated by reference in its entirety.

TECHNICAL FIELD

This disclosure relates to superconductor devices, superconductor materials, and phononic crystals.

DETAILED DESCRIPTION

Figure 1:
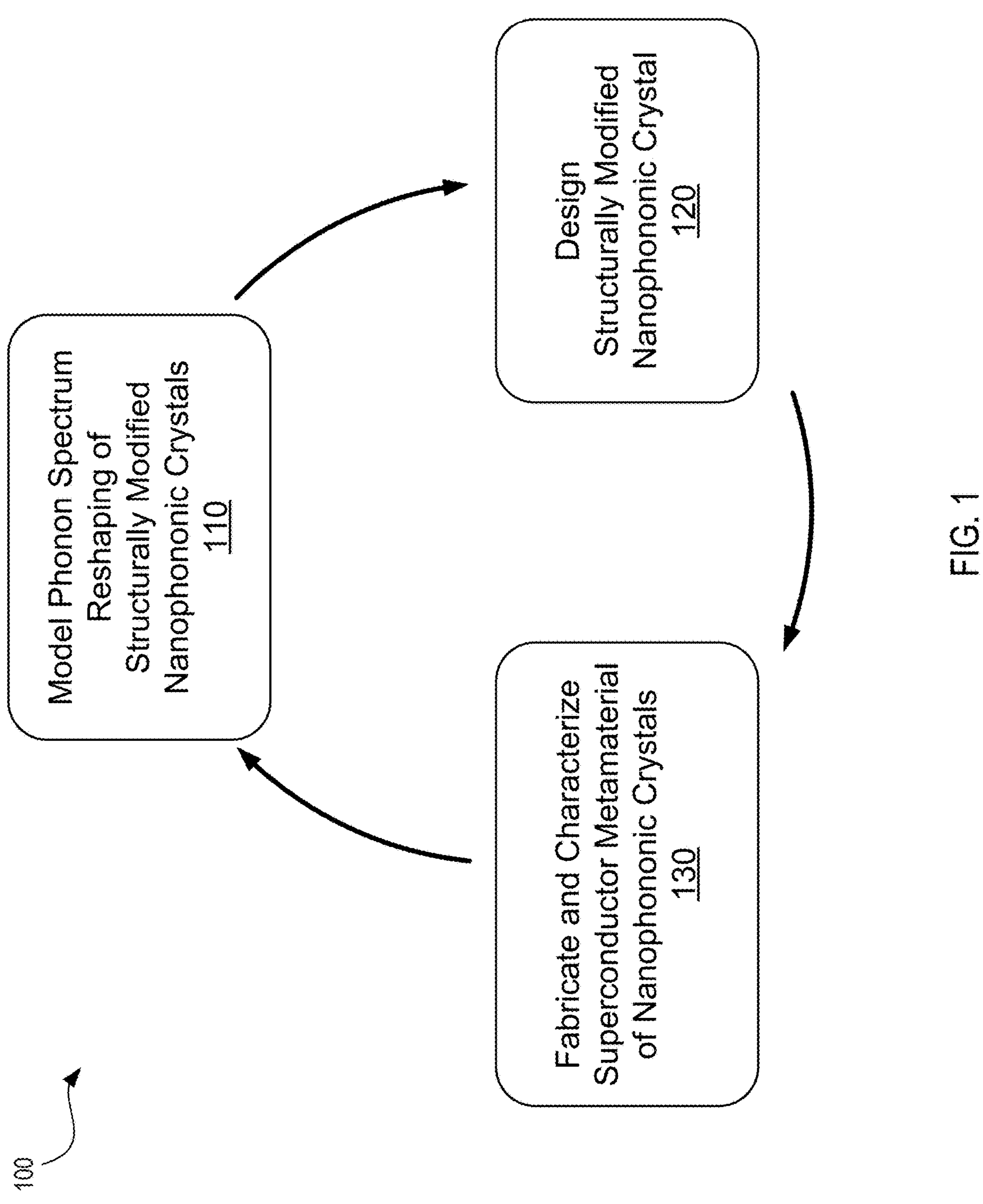
FIG. 1 illustrates a schematic diagram of a design and test cycle used to model the phonon spectrum reshaping of various phononic crystals, according to one embodiment.

This disclosure includes a description of various superconductor devices that utilize materials enhanced with quantum metamaterials, referred to herein as superconducting quantum metamaterial enhanced devices (SQMEDs) or as simply a "superconductor device" in the context of this disclosure. Some embodiments of the SQMEDs described herein exhibit superconductivity at relatively high temperatures (e.g., higher temperatures than the bulk superconductor material). The temperature at or below which a superconductor exhibits superconductivity is referred to as the critical temperature ($T_e$). The pressure above which the superconductor exhibits superconductivity can be referred to as a critical pressure ($P_c$). Accordingly, at temperatures at or below the critical temperature and pressures at or above the critical pressure, a superconductor material or device becomes superconducting (e.g., has zero electrical resistance and expels magnetic fields).

In some embodiments, the critical temperature and critical pressure may refer to ranges within which the superconductor material or device becomes superconducting (e.g., include a lower bound on the temperature and an upper bound on the pressure). When not stated otherwise, the critical temperature of a superconducting material or superconductor device is usually described in the context of a known pressure for a particular type of superconducting material or superconductor device and/or at ambient or standard pressure (approximately 101.325 kilopascals). Various examples of this disclosure include devices and materials that can be used in, for example, superconducting motors, wires, interconnects, single-photon detection devices, and magnets.

According to various embodiments, a superconducting system may include a superconducting metamaterial or SQMED, a cooling system, and a controller. The SQMED may, for example, be maintained within a cryocooler. The controller, in connection with the cooling system, may maintain the SQMED at or below the critical temperatures and/or at or above a target pressure associated with the critical temperature of the superconducting metamaterial. Some superconductor metamaterials and devices may exhibit superconductivity at different critical temperatures depending on the applied pressure and different critical pressures depending on the temperature.

The presently described systems and methods can, for example, be used to enhance the performance of a superconducting nano-electronic device for quantum information science applications via nanoscale engineering of conventional superconductors to create a "quantum superconductor metamaterial" or simply "superconductor metamaterial." Pairing in conventional superconductors relies on electron-phonon interactions, which are usually assumed to be an intrinsic material property. As described herein, by patterning a superconductor material into a nanophononic crystal (NPC), the phonon spectrum can be reshaped (via structural modifications to the nanophononic crystal) to enhance one or more superconductor parameters or properties, including the critical temperature and/or energy gap, A. In various embodiments, the reshaped phonon spectrum is used to significantly enhance (e.g., increase) the critical temperature. Theoretical and computational models are used to validate the increased critical temperature and to extend the results to other superconductor materials.

In various embodiments, a superconductor nanophononic crystal (SC-NPC) nanostructure is incorporated into the superconductor material of a superconducting nanowire single photon detector (SNSPD). Various models and tests can be used to calculate device-level metrics, including operating temperature, reset times, dark count rates, critical current, kinetic inductance, and/or quantum efficiency. The metrics can be used to quantify the impact of the SC-NPC nanostructures on the performance of the SNSPD. Specific metrics may be improved or attained by iterating between SC-NPC designs and SNSPD models. Target metrics for superconductor parameters that are relevant to, for example, military applications in sensing, LIDAR, and quantum cryptography can be attained. For instance, a superconductor-based device with an increased critical temperature enables higher operating temperatures, lower cryogen consumption, simplified device architectures, reduced system or device weight, reduced power consumption, reduced manufacturing costs, and/or reduced operating costs.

As described herein, a single-photon detector device may include a nanowire of a superconductor metamaterial made from SC-NPC nanostructures of a superconductor material. Each SC-NPC nanostructure may include a three-dimensional lattice of the superconductor material with a nanohole formed therein. The dimensions of the lattice and nanohole of each SC-NPC nanostructure may be selected (e.g., engineered at the nanoscale or quantum level) to increase electron-phonon coupling for a phonon mode of the superconductor material. In some embodiments, each SN-NPC nanostructure may be engineered to form a Helmholtz resonator.

The singe-photon detector may include a cooling system to cool the nanowire to an operating temperature that is less than the critical temperature (Tc) of the superconductor metamaterial (which is higher than the critical temperature of the underlying superconductor material). A bias circuit may be used to bias the nanowire with a bias current that is close to the superconducting critical current of the superconductor metamaterial (e.g., just below a superconducting critical current of the superconductor metamaterial). A photon incident on the superconducting metamaterial nanowire will disrupt the Cooper pairing in a localized region of the nanowire, reducing the critical current in the "hotspot." The bias circuit biases the nanowire with a bias current that is above the expected critical current within the hotspot of photon incidence. As such, an incident photon results in a localized non-superconducting region in the nanowire that functions as a normal conductor (e.g., with resistance and not as a superconductor). A detection circuit connected to the nanowire receives the bias current in response to an incident photon forming a localized non-superconducting region in the nanowire.

In various embodiments, a superconductor device may include a superconductor metamaterial formed with a plurality of SC-NPC nanostructures of a superconductor material. Each SC-NPC nanostructure may be formed as a crystal (e.g., a rectangular cubic crystal) with a nanohole formed therein. Dimensions of the rectangular cubic crystal and/or the nanohole of each SC-NPC nanostructure may be quantum-engineered or otherwise selected to modify a characteristic of at least one phonon mode of the superconductor material to alter at least one superconducting parameter of the superconductor metamaterial, relative to a bulk form of the superconducting material.

More generally, any of a wide variety of quantum-engineered superconductor metamaterial devices may incorporate any of the various embodiments of superconductor metamaterials described herein. Superconductor metamaterials are described herein and include a plurality of SC-NPC nanostructures. Each SC-NPC nanostructure may comprise a rectangular cubic crystal of an underlying superconductor material with a structural modification that alters a characteristic of a phonon mode to enhance a superconducting parameter thereof.

The presently described systems and methods include quantum-engineered superconductor metamaterials. The nanophononic crystals of a superconductor material are engineered at the nanoscale level to create quantum superconductor metamaterials. The nanoscale texture of the superconductor material can influence various superconductor parameters or properties, including but not limited to the critical current ($J_c$) and the critical temperature. However, merely modifying the texture of the superconductor material has not resulted in sizable improvements in superconducting parameters.

Instead, the presently described systems and methods utilize structural modifications to the crystal structure of each SC-NPC nanostructure. The SC-NPC nanostructures are engineered with dimensions and structural modifications to modify the phonon spectrum of the superconductor material to achieve significantly enhanced superconductor parameters relative to a bulk form of the superconductor material. For example, a SC-NPC may comprise a structurally modified crystal. The structural modification to the rectangular cubic crystal may be engineered to alter a characteristic of a phonon mode of the superconducting material to enhance a superconducting parameter thereof.

According to various embodiments, the structural modification to the SC-NPC may be a nanohole and/or a stub formation, as detailed herein. In some embodiments, the superconductor metamaterial may also include at least one twist. One or more twists may, for example, cause edges or surfaces of the superconductor metamaterial to interact with other edges or surfaces and/or create a larger ordered pattern (e.g., a Moire pattern). In some embodiments, the superconductor metamaterial and/or a superconductor metamaterial device may comprise stacked layers of the superconductor metamaterial and/or twists or folds of stacks or layers of one or more different types of superconductor materials and/or superconductor metamaterials. In some embodiments, the superconductor metamaterial includes a partially deleted, edited, folded, twisted, or otherwise modified one-dimensional lattice of the superconductor metamaterial. In some embodiments, the superconductor metamaterial includes a partially deleted, edited, folded, twisted, or otherwise modified two-dimensional lattice of the superconductor metamaterial. In some embodiments, the superconductor metamaterial may be comprised of one or more superconducting layers and/or one or more non-superconducting layers. For instance, superconductivity may be exhibited at the interface between two non-superconducting layers, one or both of which maybe twisted or twisted with respect to the other.

Phonons can be understood as the "glue" binding Cooper pairs together in conventional superconductors. Examples of conventional superconductor materials include but are not limited to niobium disulfide ($NbS_2$), titanium nitride (TiN), niobium nitride (NbN), niobium-titanium nitride (NbTiN), magnesium diboride ($MgB_2$), niobium carbine (NbC), niobium diselenide ($NbSc_2$), aluminum (Al), and tungsten silicon (WSi). The critical temperatures of these superconductor materials depend on both the phonon frequencies and their coupling to electrons. Phononic crystals (PnCs) can be structurally modified to manipulate the phonon band structure and the associated thermal and acoustic properties of materials.

As described herein, additional control is gained by reducing the dimensions of the phononic crystals to be less than the phonon mean free path (MFP) to create a nanophononic crystal. A quantum-engineered nanophononic crystal of superconductor metamaterial (e.g., an SC-NPC nanostructure) can be engineered with dimensions and structural modifications to the crystal lattice to enhance specific superconductor properties.

According to various embodiments, an SC-NPC nanostructure is formed or engineered to amplify specific phonon modes that possess strong electron-phonon (e-ph) coupling and/or optimize the dispersion of strong coupling modes (e.g., by shifting them to lower frequencies). In some embodiments, the critical temperature of a superconductor metamaterial formed with SC-NPC nanostructures is between 50-150% higher than the critical temperature of an unmodified bulk form of the same superconductor material. The SC-NPC nanostructures can be incorporated into devices to improve device performance. For example, a superconductor metamaterial comprising SC-NPC nanostructures can be used in a SNSPD.

As described herein, a single-photon detector device may include a nanowire of a superconductor metamaterial made from SC-NPC nanostructures of a superconductor material. Each SC-NPC nanostructure may include a three-dimensional lattice of the superconductor material with a nanohole formed therein. The dimensions of the lattice and nanohole of each SC-NPC nanostructure may be selected (e.g., engineered at the nanoscale or quantum level) to increase electron-phonon coupling for a phonon mode of the superconductor material.

The singe-photon detector may include a cooling system to cool the nanowire to an operating temperature that is less than the superconducting critical temperature (Tc) of the superconductor metamaterial (which is higher than the critical temperature of the underlying superconductor material). A bias circuit may be used to bias the nanowire with a bias current that is close to the superconducting critical current of the superconductor metamaterial (e.g., just below a superconducting critical current of the superconductor metamaterial). A photon incident on the superconducting metamaterial nanowire will disrupt the Cooper pairing in a localized region of the nanowire, reducing the critical current in the "hotspot." The bias circuit biases the nanowire with a bias current that is above the expected critical current within the hotspot of photon incidence. As such, an incident photon results in a localized non-superconducting region in the nanowire that functions as a normal conductor (e.g., with resistance and not as a superconductor). A detection circuit connected to the nanowire receives the bias current in response to an incident photon forming a localized non-superconducting region in the nanowire.

In various embodiments, a superconductor device may include a superconductor metamaterial formed with a plurality of SC-NPC nanostructures of a superconductor material. Each SC-NPC may have any of wide variety of shapes and have a nanohole formed therein. Each nanohole may have any of a wide variety of shapes, including, but not limited to a circle, a square, a rectangle, an oval, or another arbitrary shape or polygonal shape. Each SC-NPC nanostructure may be formed as a rectangular cubic crystal with a nanohole formed therein. Dimensions of the rectangular cubic crystal and/or the nanohole of each SC-NPC nanostructure may be quantum-engineered or otherwise selected to modify a characteristic of at least one phonon mode of the superconductor material to alter at least one superconducting parameter of the superconductor metamaterial, relative to a bulk form of the superconducting material.

More generally, any of a wide variety of quantum-engineered superconductor metamaterial devices may incorporate any of the various embodiments of superconductor metamaterials described herein. Superconductor metamaterials are described herein that include a plurality of SC-NPC nanostructures. Each SC-NPC nanostructure may comprise a rectangular cubic crystal of an underlying superconductor material with a structural modification that alters a characteristic of a phonon mode to enhance a superconducting parameter thereof.

The presently described systems and methods leverage models developed to link the predicted increases in critical temperature, $T_c$, and other material(s)-level superconductor parameters, such as the energy gap, $\Delta$, critical current, $J_c$, etc., to specific SNSPD performance metrics. For example, the increased critical temperature and energy gap can lead to higher operation temperatures, lower false-count rates from the infrared (IR) background, and faster reset times. In some embodiments, the SC-NPC nanostructures of a superconductor metamaterial may be engineered to control the kinetic inductance ($L_k$) to improve or otherwise control the device recovery times in an SNSPD.

According to various embodiments, superconductor metamaterial devices can be used to form composite devices. For example, a superconductor metamaterial comprising a plurality of quantum-engineered SC-NPC nanostructures can be used to manufacture kinetic inductance parametric amplifiers. The methods described herein of reshaping the phonon spectrum to control the properties of a quantum superconductor metamaterial can be used to engineer a wide variety of quantum metamaterials that can be used in multiple fields (e.g., thermoelectric devices and spintronic devices).

In various embodiments, the SC-NPC nanostructures can be used to tune or modify various properties and parameters of superconducting quantum devices. For example, quantum superconductor metamaterials may be adapted to improve the properties of superconducting qubits. For example, a superconducting metamaterial may have an increased superconductor gap delta (Δ) as compared to the underlying bulk superconducting material. The increased superconductor gap delta (Δ) may increase the high-frequency limit of a superconducting metamaterial device. Furthermore, increasing the superconductor gap delta (A) can reduce the quasiparticle (QP) noise in a superconducting metamaterial device. In some embodiments, the SC-NPC nanostructures are specifically tailored to increase quasiparticle coupling to phonons, thereby increasing the quasiparticle relaxation rate and reducing the excess population thereof. In still other embodiments, the SC-NPC nanostructures are specifically engineered to suppress decoherence and energy dissipation from phonon scattering, increasing the population relaxation time (T1) and coherence lifetime (T2).

In other applications, SC-NPC nanostructures are used for superconductor metamaterials in superconducting nanoelectronics. For example, SC-NPC nanostructures may be used to modify the kinetic inductance of a superconductor material, which is inversely proportional to the superconductor gap delta (Δ). In some embodiments, the SC-NPC nanostructures exhibit improved traveling-wave kinetic inductance and can be used to form improved kinetic inductance parametric amplifiers. In some embodiments, the kinetic inductance properties are further modified by patterning a film (not necessarily in an SC-NPC nanostructures geometry) to increase the normal state resistivity, which may also modify the critical temperature and/or the gap delta. Since the kinetic inductance is related to the normal state resistivity/Δ, both of these factors can modify kinetic inductance and thus the Kerr nonlinearity, which may be relevant to the design of a parametric amplifier.

In some embodiments, a quantum superconductor metamaterial comprising SC-NPC nanostructures is used to enhance THz emission from the intrinsic Josephson junctions in cuprates like BSCCO and/or in conventional superconductors. For example, a metasurface may be fabricated to amplify the emitted radiation over a specific wavelength range. A traditional metasurface controlling light-matter interactions may be implemented to accomplish this without the use of SC-NPC nanostructures.

Many existing computing devices and infrastructures may be used in combination with and/or incorporate the presently described systems and methods. Some of the infrastructure that can be used with embodiments disclosed herein, such as cooling systems, controllers, and the like, is already available. Moreover, several known manufacturing techniques may be utilized to form aspects of the various embodiments described herein.

The components and variations of some of the disclosed embodiments are described and illustrated in the figures herein. Many portions thereof could be arranged, designed, or depicted in a wide variety of different configurations. Furthermore, the features, structures, and operations associated with one embodiment may be applied to or combined with the features, structures, or operations described in conjunction with another embodiment. In many instances, well-known structures, materials, or operations are not shown or described in detail to avoid obscuring aspects of this disclosure. The right to add any described embodiment or feature to any one of the figures and/or as a new figure is explicitly reserved.

The embodiments of the systems and methods provided within this disclosure are not intended to limit the scope of the disclosure but are merely representative of possible embodiments. In addition, the steps of a method do not necessarily need to be executed in any specific order, or even sequentially, nor do the steps need to be executed only once.

FIG. 1 illustrates a schematic diagram 100 of an example design and test cycle, according to one embodiment. The cycle includes modeling, at 110, the phonon spectrum reshaping of various nanophononic crystals. The term nanophononic crystal is used to describe a phononic crystal that has nanometer-scale dimensions that are less than the phonon mean free path. The modeling, at 110, may be used, in some embodiments, to model the influence of reshaping the phonon spectrum on superconductivity for various superconductor materials. For example, the models may utilize computed ground-state properties of electrons and phonons as well as their coupling based on first principles.

The modeling approach allows for models to be accurately generated with calculated critical temperatures and identified phonon modes that are most strongly coupled to electrons, which influence the critical temperature ($T_c$) the most. The models are leveraged to enhance the critical temperature ($T_c$) of a superconductor material (or modify other superconductor parameters of a superconductor material) for a specific application and operational environment.

The cycle includes designing, at 120, structurally modified nanophononic crystals based on the modeled effects on the phonon modes of the superconductor material. The cycle includes fabricating and characterizing, at 130, structurally modified nanophononic crystals. This disclosure includes various examples of structurally modified nanophononic crystals (e.g., SC-NPC nanostructures) and characterizations of the superconductivity parameters thereof.

Figure 2A:
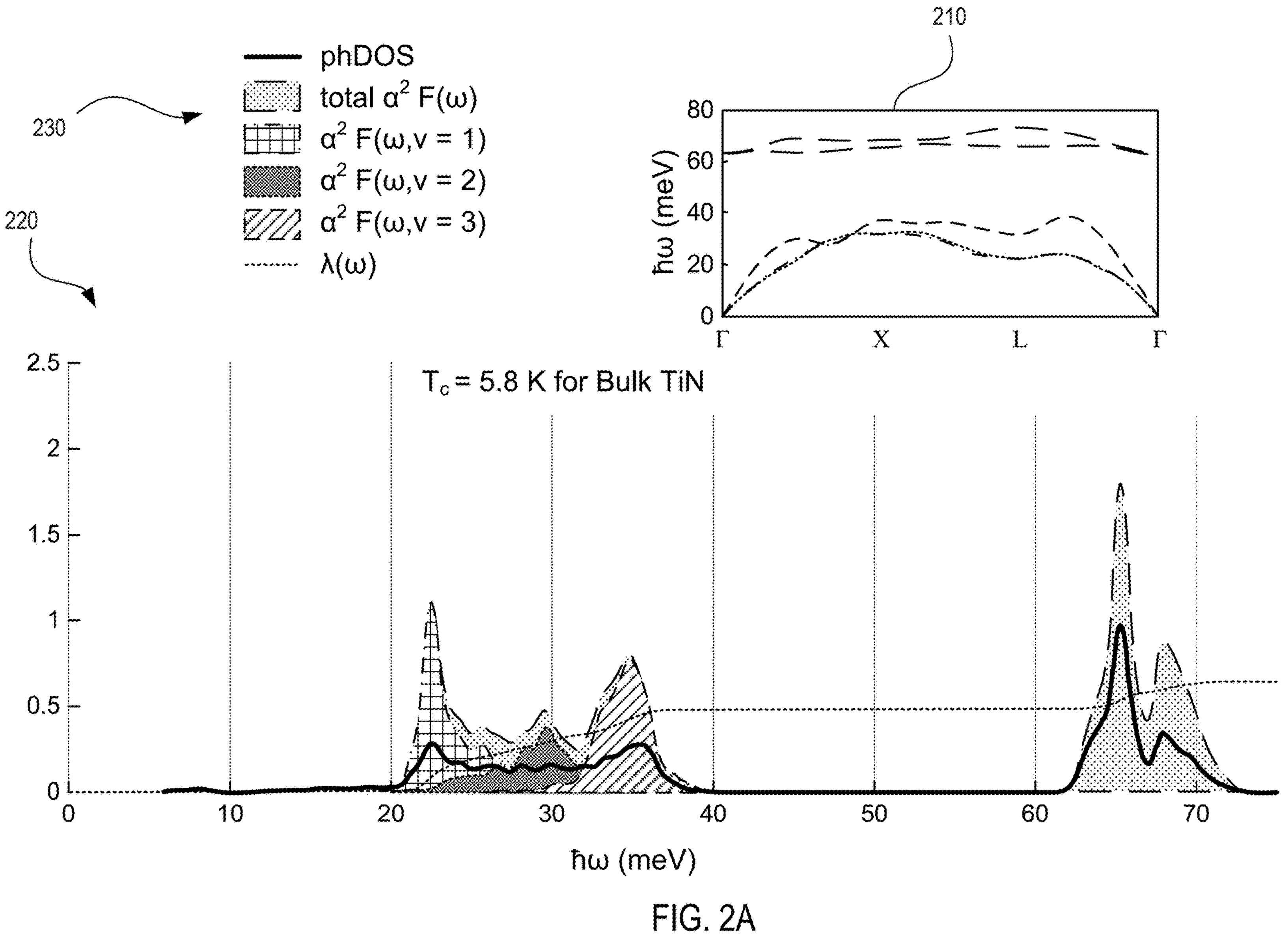
FIG. 2A illustrates graphs related to an unmodified titanium nitride (TiN) superconductor material.

FIG. 2A illustrates graphs 210 and 220 related to an unmodified TiN superconductor material with a critical temperature ($T_c$) of 5.8 K at ambient pressure. The first graph 210 illustrates the phonon band structure of the unmodified TiN superconductor material. Each phonon mode is depicted using a different line pattern, per the legend 230.

The second graph 220 illustrates the phonon density of states (phDOS) as a solid black line. The second graph 220 also illustrates the energy with respect to the total Eliashberg function, $\alpha^2F(\omega)$, and the Eliashberg function for each phonon mode using different shadings and line patterns, per the legend 230. The Eliashberg function, $\alpha^2F(\omega)$, captures the strength of the electron-phonon coupling for each phonon mode with energy $\omega$. The second graph 220 also illustrates the total electron-phonon coupling (e-ph coupling) strength $\lambda$, for the unmodified TiN superconductor material as a dashed line, per the legend 230.

Figure 2B:
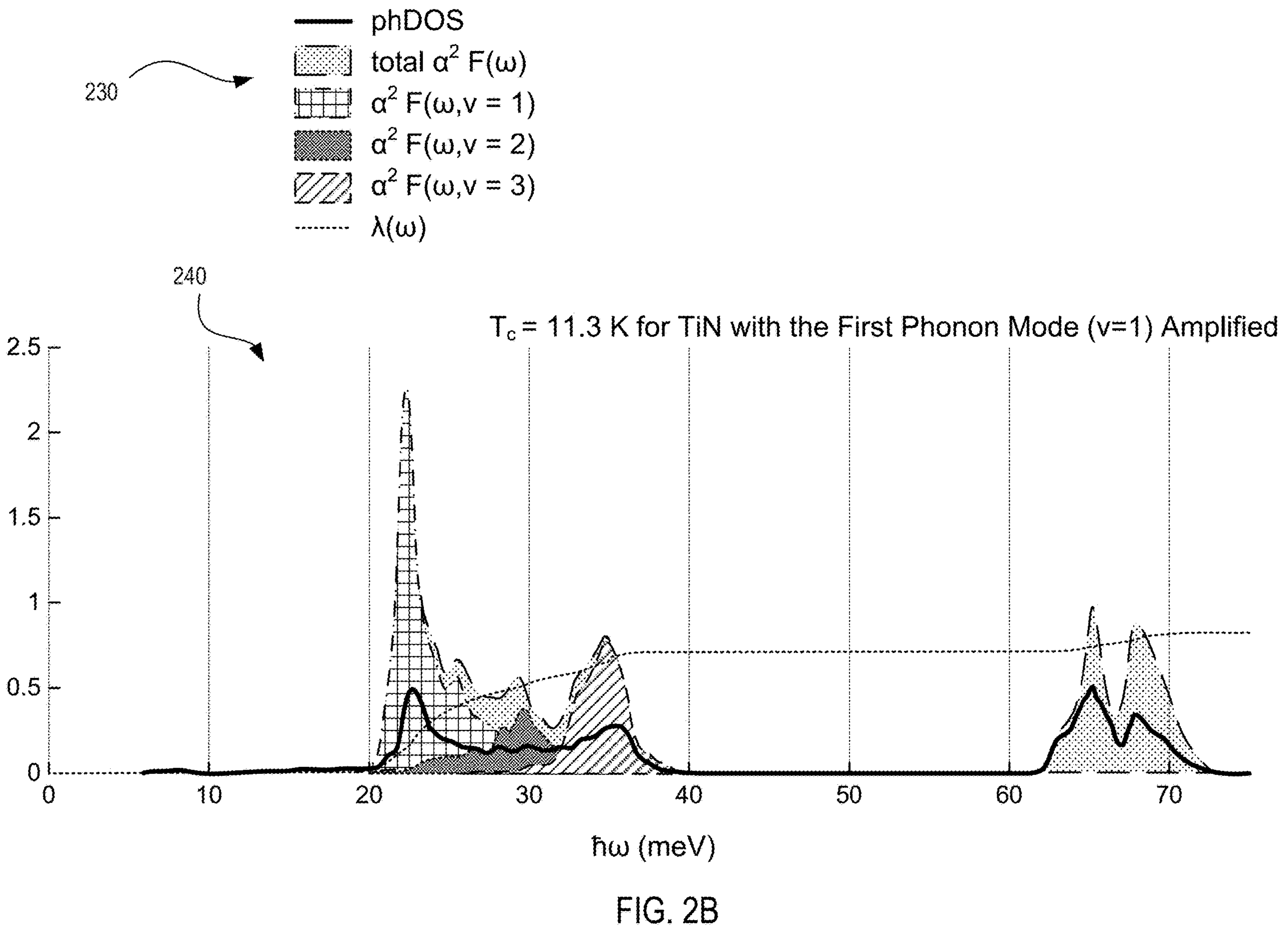
FIG. 2B illustrates graphs of the same values for a TiN-based superconductor metamaterial with the first phonon mode amplified, according to one embodiment.

FIG. 2B illustrates a graph 240 of the same values for a TiN-based superconductor metamaterial with the first phonon mode amplified, according to one embodiment. As illustrated, amplification of the first phonon mode (illustrated with a box shading) results in an increase in the critical temperature ($T_c$) to 11.3 K. As described in greater detail below, the first phonon mode may be amplified using nanophononic crystals with structurally modified lattice structures, such as nanoholes (cavities, holes, voids, etc.)

and/or stub formations. In various embodiments, a plurality of structurally modified nanophononic crystals (e.g., with nanoholes and/or stubs) may be arranged to form a TiN-based superconductor metamaterial. In some embodiments, the structurally modified nanophononic crystals may be incorporated into a substrate of unmodified TiN superconductor material. The structurally modified nanophononic crystals are structurally engineered at the nanoscale level (e.g., defect-engineered or nano-engineered) to resonantly amplify one or more phonon modes, as illustrated by the amplified first phonon mode in FIG. 2B.

Figure 2C:
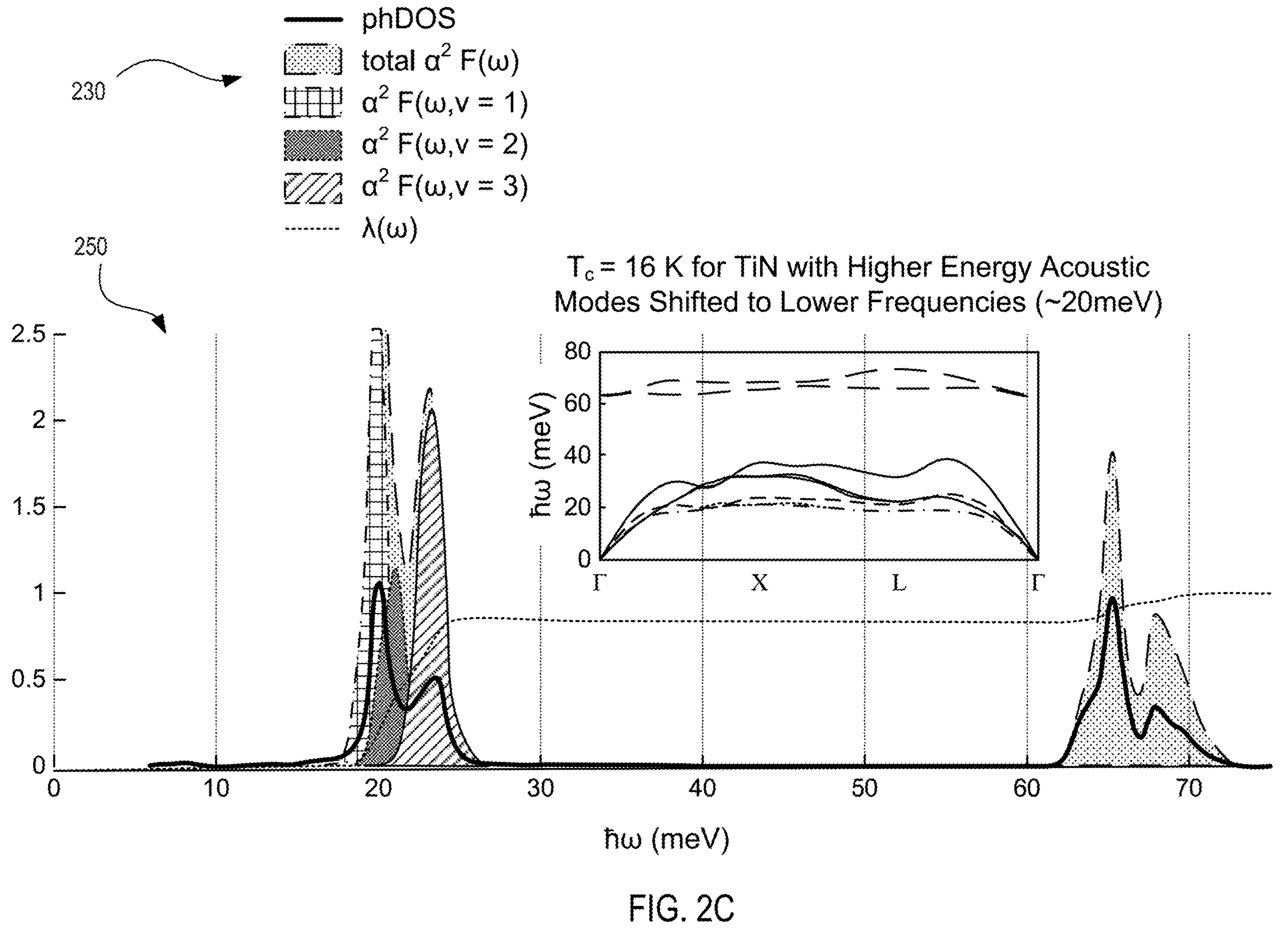
FIG. 2C illustrates the same values for a TiN-based superconductor metamaterial after shifting higher energy acoustic modes to lower frequencies, according to one embodiment.

FIG. 2C illustrates similar graphs 250 for a quantum-modified TiN-based superconductor metamaterial in which higher energy acoustic phonon modes are shifted to lower energies, according to one embodiment. As illustrated, the higher energy acoustic phonon modes (e.g., phonon modes near ~30-40 meV) are shifted toward a lower energy (lower frequency) of approximately 20 meV. The modified phonon spectrum results in an increased critical temperature ($T_c$) of 16 K, which is nearly three times higher than that of the unmodified bulk TiN in FIG. 2A.

The electron-phonon coupling strength $\lambda$, depends inversely on frequency. Accordingly, decreasing the frequency of one or more phonon modes increases its electron-phonon coupling strength and, in turn, increases the critical temperature ($T_c$). Specifically, shifting the higher energy acoustic modes towards approximately 20 meV results in nearly triple the critical temperature as compared to the bulk, unmodified TiN material.

FIGS. 2A-2C illustrate the increase in critical temperature attainable by the use of structurally modified nanophononic crystals to form a TiN-based superconductor metamaterial. Comparable enhancements to superconductor parameters (e.g., increased critical temperature) are attainable with structurally modified nanophononic crystals of other superconductor materials, including one or more of $NbS_2$, TiN, NbN, NbTiN, $MgB_2$, NbC, $NbSc_2$, Al, and WSi.

Figure 3:
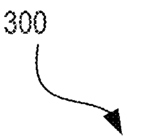
FIG. 3 illustrates a graph of resistance relative to the temperature of a sample of annealed NbTiN film, according to one embodiment.
Figure 3:
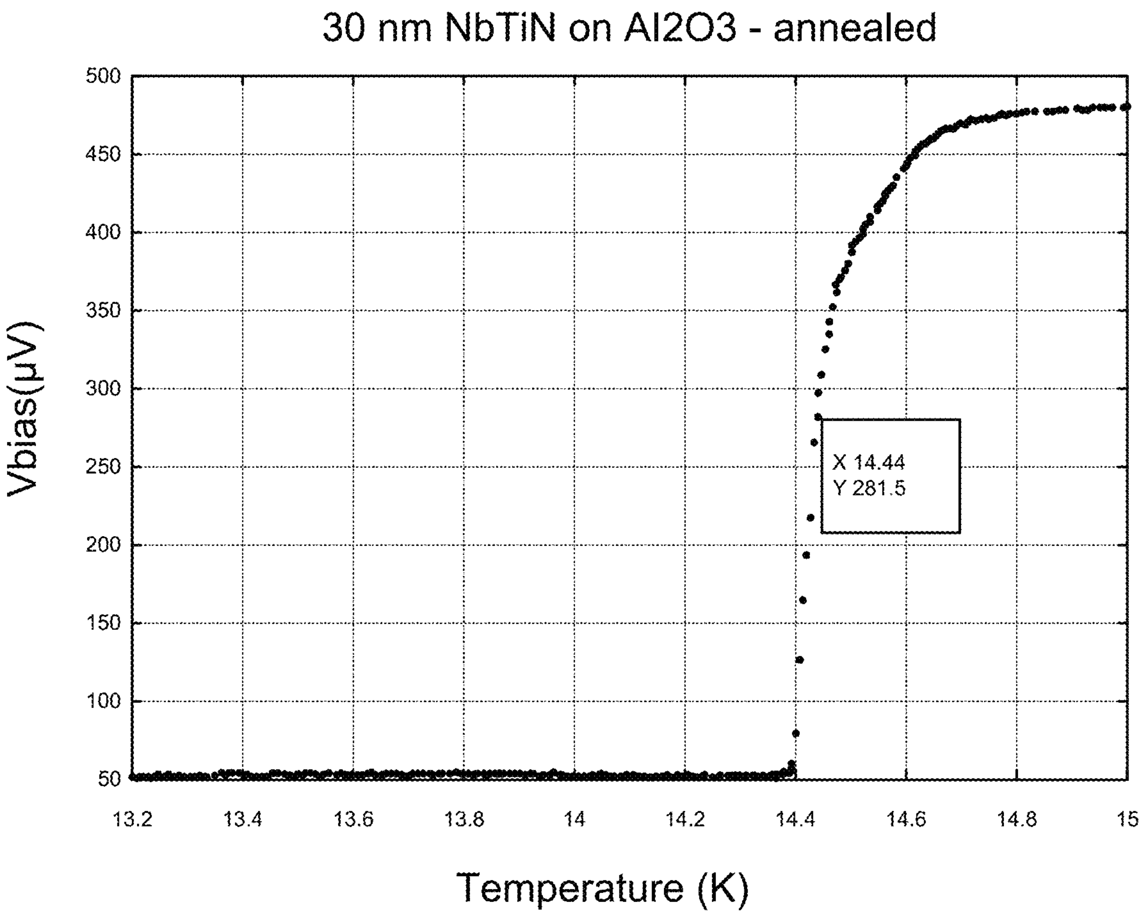

FIG. 3 illustrates a graph 300 of resistance relative to the temperature of a sample of an annealed NbTiN film on an $Al_2O_3$ substrate, according to one embodiment. The presently described systems and methods include, in some embodiments, may utilize a high-quality NbN deposition process. In some embodiments, NbTiN films with increased crystallinity and higher critical temperatures are manufactured using temperatures up to 500° C. High-temperature annealed NbTiN films have critical temperatures of approximately 16.5 K prior to nanophononic crystal engineering and optimization.

In various embodiments, defect lithographic patterns (e.g., nanoholes stub formations, etc.) are defined using an e-beam direct write system (e.g., using a Raith 150 Ebeam direct write system with 5 nm resolution) and/or using a mask and bond aligner (e.g., a 245 nm deep-UV Karl Suss MABA6 Mask and Bond Aligner). The defect patterns can be transferred into the superconducting layer(s) using etch tools, such as fluorine+chlorine or fluorine-based etch tools (e.g., using a loadlocked Oxford Plasma lab ICP-RIE etch tool). The presently described systems and methods may be used to establish very anisotropic Nb, NbTiN, and NbN dry etches to transfer lithographic patterns into films. In some embodiments, ion beam milling is used to implement the structural modifications to individual SC-NPC nanostructures. For example, ion beam milling can be used to form a nanohole in a crystal. Stub formations may be additively formed on a SC-NPC or formed via removal of material from a SC-NPC. For example, a stub formation may be lithographically defined on the crystal, after which the surrounding material is etched to reveal the stub formation. Alternatively, additional material may be deposited on a crystal before the lithographic and etching processes, such that the stub formation is formed from the additional material deposited on the crystal.

Figure 4:
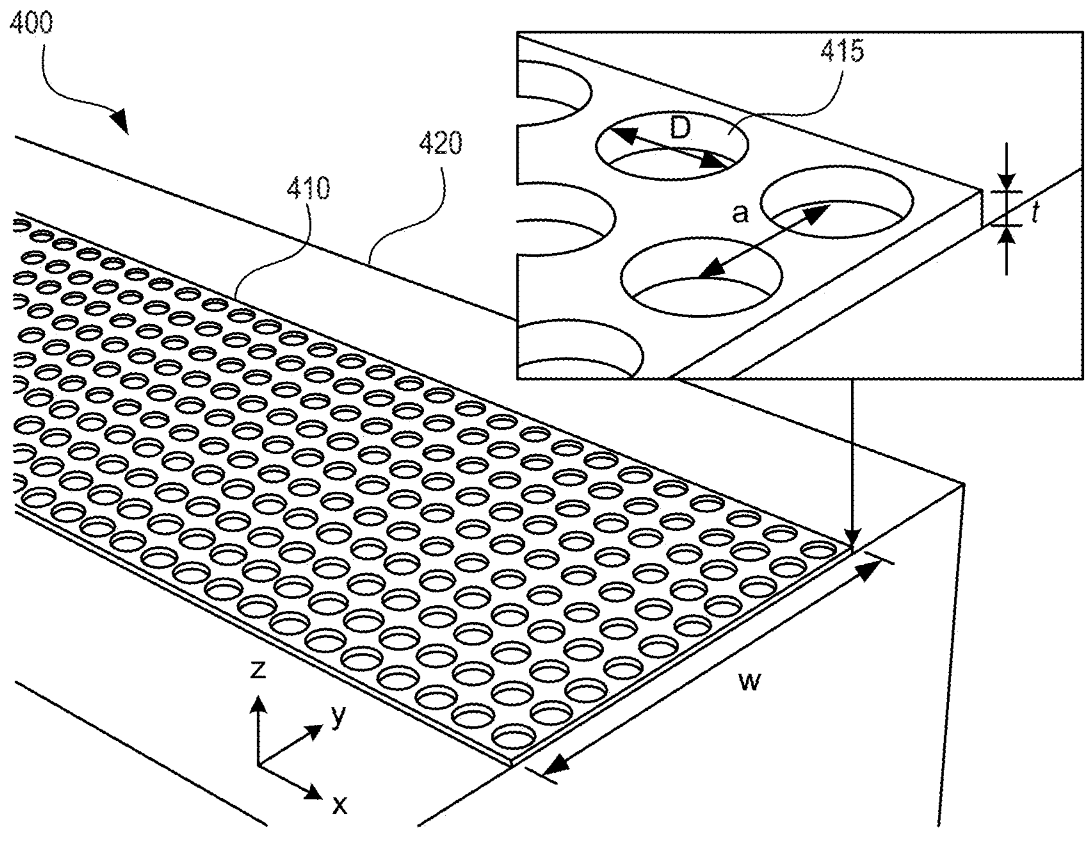
FIG. 4 illustrates a schematic diagram of a simplified superconducting nanowire single-photon detector (SNSPD) formed with a superconductor metamaterial, according to various embodiments.

FIG. 4 illustrates a schematic diagram of a simplified superconducting nanowire single-photon detector (SNSPD) 400 that can be formed with a superconductor metamaterial, according to various embodiments. A superconductor metamaterial formed with SC-NPC nanostructures of TiN, NbN, and/or $MgB_2$ is amenable to large-scale fabrication. The SNSPD 400 may be formed as a nanowire 410 in a single straight line on a substrate 420. Alternatively, the SNSPD may be formed with a meander pattern on the substrate to increase optical absorption, as is appreciated by those of skill in the art.

The absorption of a single photon can be modeled, which is directly linked to the detection efficiency and can approach 100% in some devices. The absorption can be modeled in periodic structures like meandered nanowires using rigorous coupled-wave analysis (RCWA), which yields the electric field profile and absorption in the nanowire. In some embodiments, the SNSPD may be positioned within an optical cavity to increase or maximize optical absorption. In some embodiments, a classical electromagnetic model may be utilized that treats the nanowire as a metal embedded in a dielectric medium with dimensions w (width), 1 (thickness), and/(length). According to various embodiments, the nanohole(s) 415 in the SC-NPC nanostructure may have diameters, D, between approximately 10 nanometers and 50 nanometers. To avoid any influence of the nanowire pattern on the phononic band structure, the width, w, is much greater than the diameter, D, of the nanoholes (e.g., w >>D). An SNSPD with a larger width, such as a micron-wide SNSPD, can still detect a single photon and may have a lower kinetic inductance ($L_k$) and higher critical currents ($J_c$). The combination of a wide nanowire and a two-dimensional nanohole pattern (e.g., a pattern or distribution of nanoholes with varying nanohole spacings, nanohole sizes, filled nanoholes, or unfilled nanoholes) can, in some embodiments, be used to reduce polarization sensitivity, which may be a significant SNSPD metric in some implementations and use cases.

The SC-NPC nanostructure optical absorption and detection efficiency can be evaluated by comparison with the calculated wavelength-and-temperature-dependent absorption and detection efficiency with those of a bare superconductor nanowire made from the same bulk superconductor material (e.g., unmodified superconductor material). The SC-NPC nanostructures used in the superconductor metamaterial of the SNSPD can be engineered to achieve balanced or optimized performance, including a balancing or optimization of the wavelength-and-temperature-dependent absorption parameter and the detection efficiency parameter, depending on the desired balance between critical temperature and efficiency. In some embodiments, a metamaterial layer is added to increase light absorption.

Figure 5:
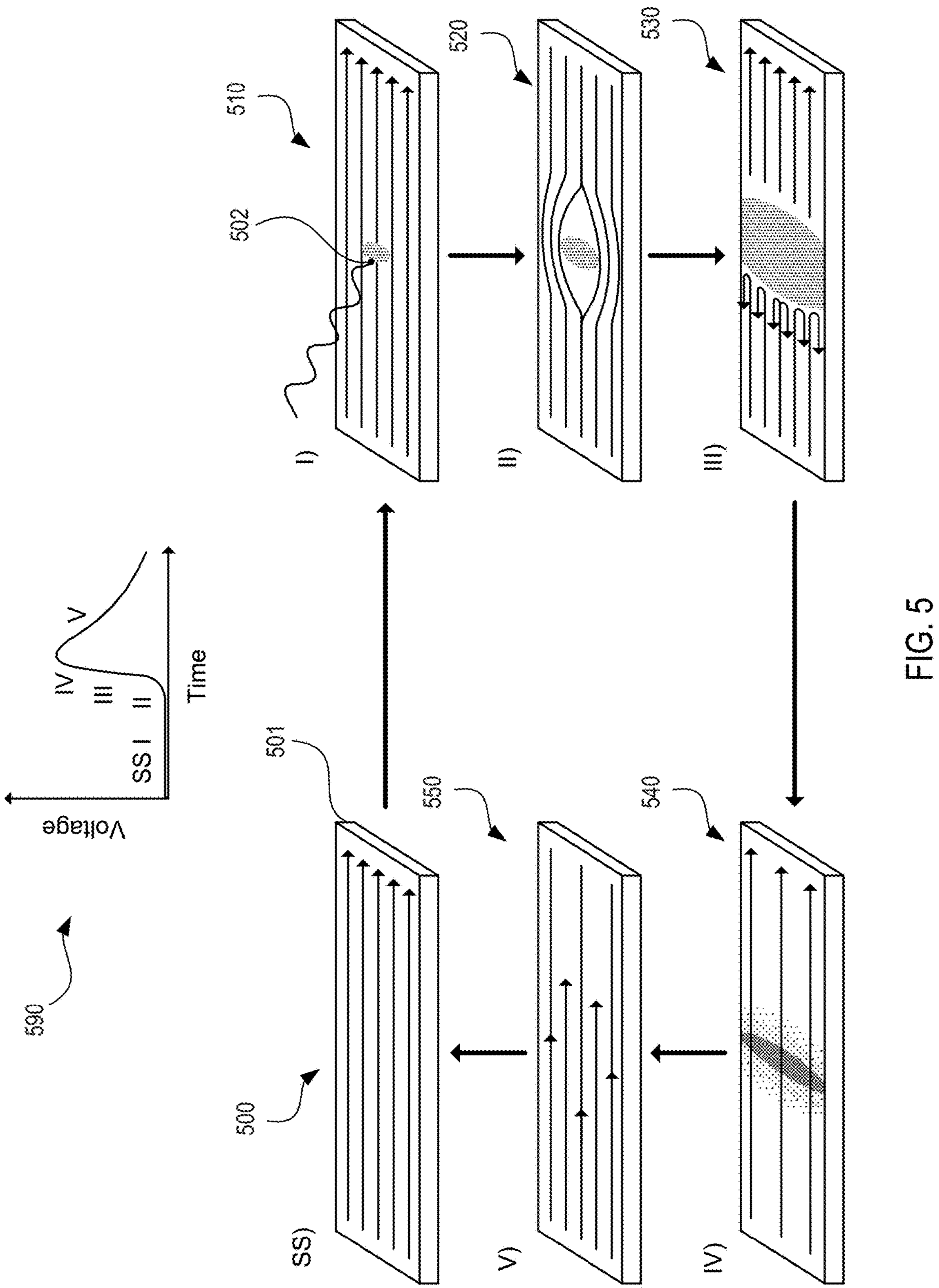
FIG. 5 illustrates the dynamics of hotspot formation and return to equilibrium in an SNSPD, according to various embodiments.

FIG. 5 illustrates the dynamics of hotspot formation and return to equilibrium in an SNSPD, according to various embodiments. In various embodiments, the formation and evolution of the non-superconducting "hotspot" in the nanowire is relevant to the engineered design. In a steady state, at 500, bias current (illustrated as arrows) flows through the nanowire 501. The nanowire 501 may be part of a SNSPD. The nanowire 501 may be formed using a superconductor metamaterial with a plurality of SC-NPC nanostructures, as described according to any of the various embodiments herein. The bias current is tuned to be below the critical current ($J_c$) of the superconductor metamaterial.

A single photon 502 is incident on the nanowire 501 and initially suppresses superconductivity, at 510, due to the excess quasiparticles created by the relaxation of a photon-induced electron-hole pair. The localized region of the nanowire, referred to as a "hotspot," exhibits a local, reduced superconducting critical current. The bias current is tuned to exceed the local, reduced superconducting critical current, and so the hotspot becomes non-superconducting. As the hotspot grows, at 520 and 530, through vortex-induced heating, the applied bias current is diverted into parallel readout circuitry (e.g., a detection circuit) connected via a low-resistance connection.

The detected bias current (e.g., as a voltage) is used to register the absorption of the single photon 502 by the nanowire 501. A phenomenological lumped-circuit model that represents the kinetic inductance with an inductor and the hotspot resistance by $R_n(t)$ can approximate the timescales governing the response. Photoinduced quasiparticle generation suppresses the threshold for vortex formation, which then increases the resistance through heating while diffusing through the superconductor to create the observed normal hotspot (i.e., a localized non-superconducting region) in the nanowire. This directly impacts metrics, including the reset time $t_r$, timing jitter $t_j$, and dark count rate. The graph 590 depicts a voltage response detected by the readout circuitry at each of the various stages of hotspot formation and reset.

The presently described SC-NPC nanostructures can be designed to form a superconductor metamaterial with target performance metrics for use in an SNSPD. The design process may include, for example, a two-temperature (electrons and phonons) model used to simulate quasiparticle relaxation and system evolution back to thermal equilibrium. The influence of the SC-NPC nanostructures can be included by modifying parameters like the phDOS, e-ph coupling ($\lambda$), and/or energy gap ($\Delta$). The temporal evolution of the energy gap may be treated with a modified time-dependent Ginzburg-Landau (TDGL) equation, which provides insight into superconductor vortex dynamics and enables the calculation of the time-dependent voltage pulse generated due to photoinduced superconductor state suppression. These calculations may be used to model the position-dependent absorption in the NW, which directly impacts the timing jitter ($t_j$). The influence of the SC-NPC nanostructures can be incorporated into the TDGL model via the modified values of the critical temperature of the superconductor metamaterial and/or the energy gap. The TDGL models can also be adapted to calculate the critical current ($J_c$) and de-pairing current ($J_d$), which may be significant parameters for SNSPD operation in some implementations and embodiments.

The expected impact of the SC-NPC nanostructures can be quantitatively assessed based on detector metrics such as, but not limited to, reset time, timing jitter, and/or dark-count rate. The detector performance may be affected not only by the altered critical temperature but also by the modified device geometry. For example, the nanoholes in the SC-NPC nanostructures may increase barriers for vortex entry, potentially affecting the detector sensitivity and/or susceptibility to dark counts. Large-area single-element detectors can be limited in reset time by the kinetic inductance, which scales inversely with the energy gap (and thus critical temperature). Accordingly, the SC-NPC nanostructures may be structurally modified to reduce the reset time. The fundamental limit on timing jitter is also $\propto 1/\Delta$. As such, the timing jitter may be enhanced by the increased critical temperature. Finally, the increase in the energy gap will reduce the sensitivity to the IR background that dominates false counts in SNSPDs, reducing the dark count rate.

Once the hotspot is large enough to divert the bias current to the readout circuitry, at 530 and 540, the superconductor begins to return to equilibrium, at 550. However, other effects, including latching (when the current returns to the nanowire before it has fully cooled down) and afterpulsing (when the return current exceeds the switching current, initiating another voltage pulse), can take place. An electro-thermal model may be used to simulate or model the heat transfer process that returns the SNSPD to equilibrium or steady state, at 500. This directly impacts the reset time ($t_r$) and, thus, the maximum count rate (~$3t_r$).

Figure 6:
FIG. 6 illustrates simulated electron and phonon temperatures in the center of a hotspot as a function of the substrate temperature, according to one embodiment.
Figure 6:
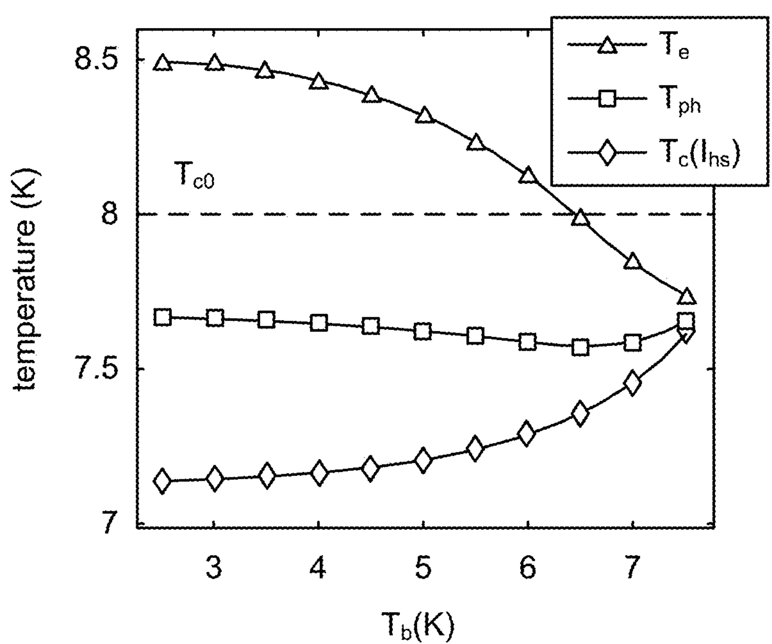

FIG. 6 illustrates a graph 600 of simulated electron temperature ($T_e$) and phonon temperature ($T_{ph}$) in the center of a hotspot as a function of the substrate temperature ($T_b$), according to one embodiment. The SC-NPC nanostructures may be structurally engineered based on models and/or simulations of the return of the nanowire to equilibrium after a hotspot is established. In some embodiments, an electro-thermal model based on the modified Skocpol-Beasley-Tinkham model is utilized, which also accounts for the importance of the thermal boundary conductance (TBC) in influencing heat transport between a superconductor film nanowire and substrate.

Figure 7:
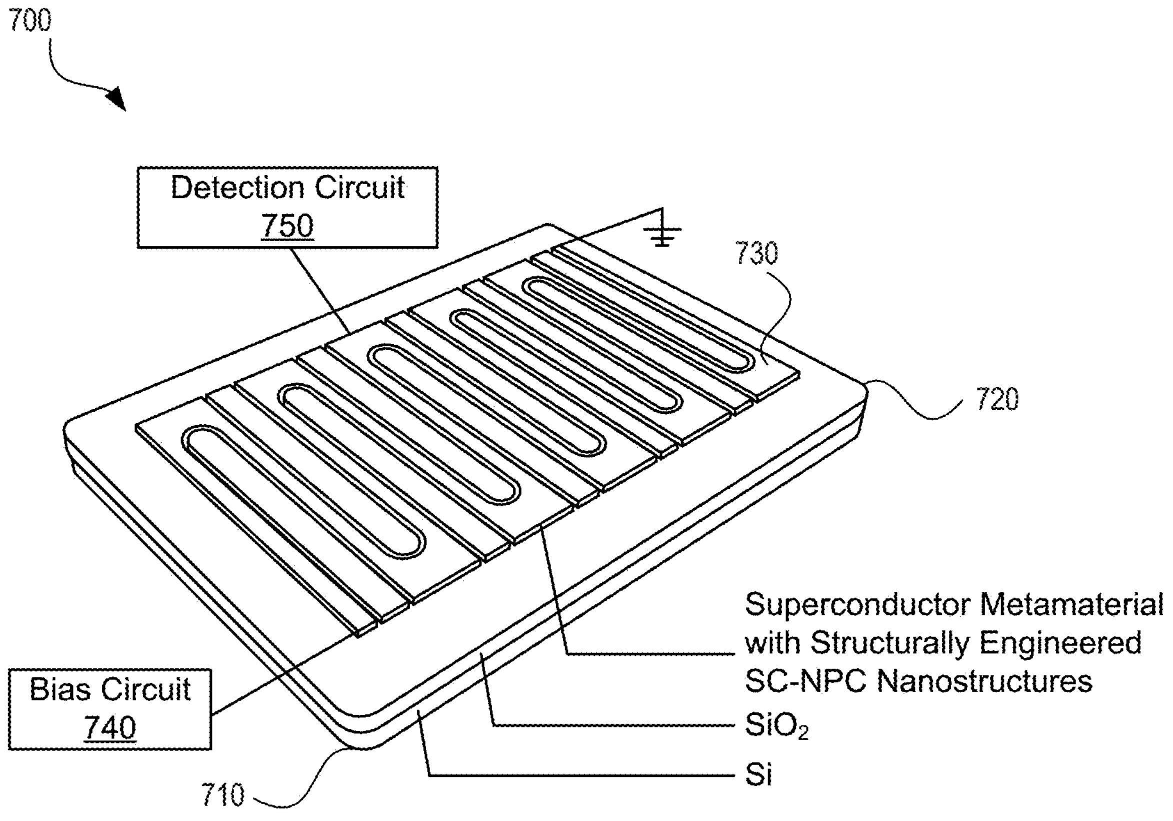
FIG. 7 illustrates an example of a meandering SNSPD formed with a superconductor metamaterial, according to one embodiment.

FIG. 7 illustrates an example of a meandering SNSPD 700, according to one embodiment. As illustrated, a dielectric substrate may include a silicon layer 710 and a silicon dioxide or silica layer 720. Alterative materials, layers, configurations, and arrangements may be utilized as is understood in the formation of SNSPDs. In the illustrated embodiment, a nanowire 730 is formed with a meandering path in a superconductor metamaterial (e.g., by etching). The superconductor metamaterial is formed with a plurality of SC-NPC nanostructures of a superconductor material. As described herein, each SC-NPC nanostructure may be formed as a three-dimensional lattice of the superconductor material with a nanohole formed therein (or other structure modification) to increase electron-phonon coupling for a phonon mode of the superconductor material.

A bias circuit 740 biases the nanowire with a bias current that is below the superconducting critical current of the superconductor metamaterial but above the reduced superconducting critical current in a photon-induced hotspot. As such, an incident photon forms a normal hotspot or localized non-superconducting region in the nanowire 730. A detection circuit 750 is connected to the nanowire 730 via a conductor with relatively small but non-zero resistance. In steady-state operation, the nanowire is superconducting and has no resistance. The bias current flows through the nanowire 730. An incident photon creates a localized non-superconducting region in the nanowire 730. The increased resistance in the nanowire 730 causes some of the bias current to be redirected to the detection circuit 750. In some embodiments, the nanowire 730 may be formed with multiple layers of superconductor material, at least one of which is a superconducting metamaterial. The superconducting metamaterial may, for example, improve the thermal boundary conductance between the nanowire 730 and the silica substrate 720 and thus improve the reset time.

Figure 8A:
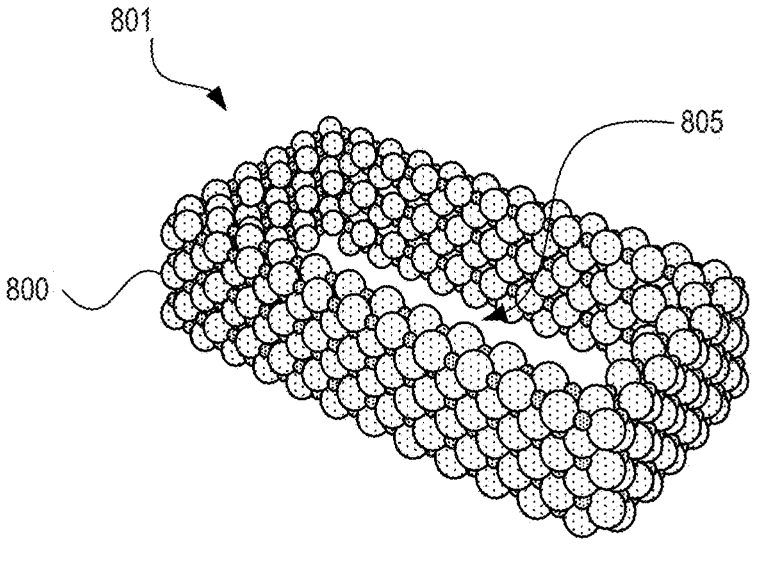
FIG. 8A illustrates an example of a superconducting nanophononic crystal (SC-NPC) nanostructure with a nanohole, according to one embodiment.
Figure 8A:
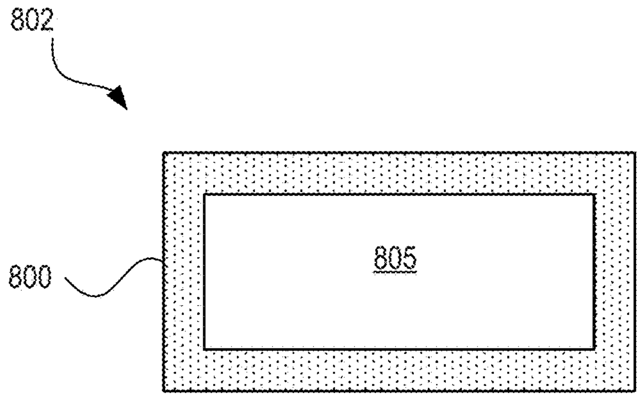
Figure 8A:
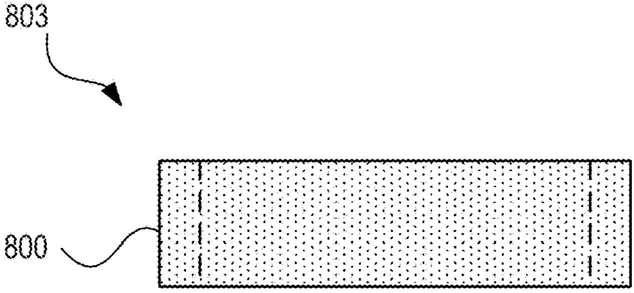

FIG. 8A illustrates an example of a TiN SC-NPC nanostructure 800 with a nanohole 805, according to one embodiment. The perspective view 801 of the TiN SC-NPC nanostructure 800 includes a representation of the asymmetric units of paired titanium and nitrogen atoms forming the walls of the TiN SC-NPC nanostructure 800. The top-down view 802 illustrates a top view of the sidewalls of the TiN SC-NPC nanostructure 800 with the rectangular nanohole 805. A side view 803 of the TiN SC-NPC nanostructure 800 includes dashed lines showing the internal location of the nanohole 805.

In the illustrated example, the TiN SC-NPC nanostructure 800 is formed from a conventional cell (e.g., a three-dimensional lattice) of TiN superconductor metamaterial that has a length of 12 asymmetric units (50.96 Å), a width of 6 asymmetric units (25.48 Å), and thickness of 3 asymmetric units (12.74 Å). The nanohole 805 passes through the top and bottom of the TiN SC-NPC nanostructure 800 and is centered along the length and width of the TiN SC-NPC nanostructure 800. In the illustrated example, the nanohole 805 has a length of 10 asymmetric units, a width of 4 asymmetric units, and a thickness of 3 asymmetric units. As such, the sidewalls of the TiN SC-NPC nanostructure 800 have a thickness of 1 asymmetric unit (e.g., one titanium atom and one nitrogen atom).

In alternative embodiments, an SC-NPC nanostructure may be a three-dimensional lattice or conventional cell of any of a wide variety of superconductor materials. The three-dimensional lattice of the superconductor material may be in the form of a rectangular cubic crystal with a length of X asymmetric units of the superconductor material, a width of Y asymmetric units of the superconductor material, and a thickness of Z asymmetric units of the superconductor material, where each of X, Y, and Z are integer values.

Each SC-NPC nanostructure may be structurally engineered or otherwise include a structural modification, such as a nanohole. The nanohole may, for example, be rectangular with a length of A asymmetric units of the superconductor material, a width of B asymmetric units of the superconductor material, and a thickness of C asymmetric units of the superconductor material, where each of A, B, and C are integer values with $A \leq (X-2)$, $B=(Y-2)$, and $C=Z$.

According to various embodiments, the nanohole is engineered to increase electron-phonon coupling for a phonon mode of the superconductor material, thereby altering (enhancing) at least one superconducting parameter of the superconductor metamaterial formed by the SC-PNC nanostructures, relative to the unmodified bulk form of the underlying superconductor material.

Figure 8B:
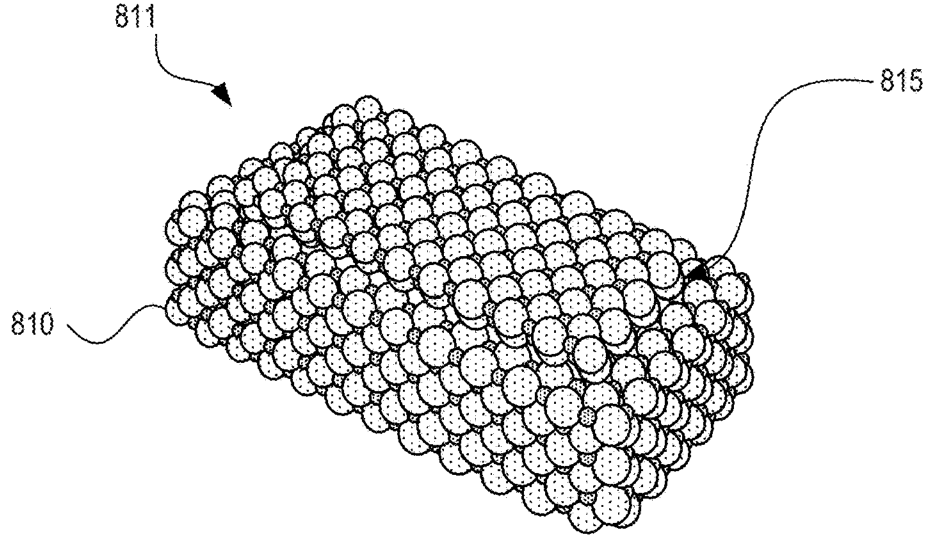
FIG. 8B illustrates an example of an SC-NPC nanostructure with a stub formation, according to one embodiment.
Figure 8B:
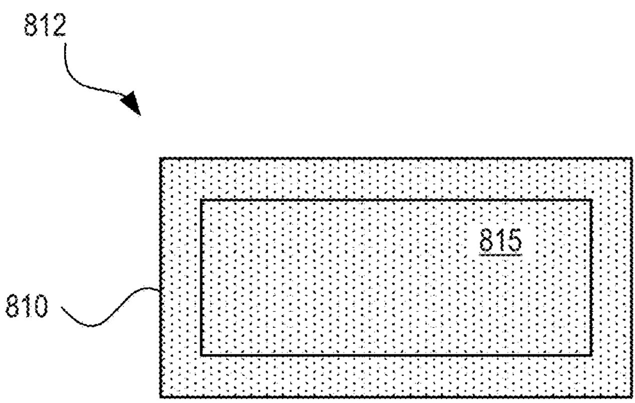
Figure 8B:
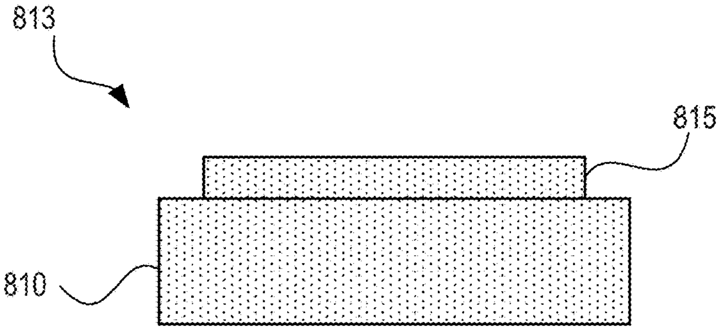

FIG. 8B illustrates an example of a TiN SC-NPC nanostructure 810 with a stub formation 815, according to one embodiment. The perspective view 811 of the TiN SC-NPC nanostructure 810 includes a representation of the asymmetric units of paired titanium and nitrogen atoms forming the walls and filling the volume of the TiN SC-NPC nanostructure 810. The top-down view 812 illustrates a top view of the sidewalls of the TiN SC-NPC nanostructure 810 with the stub formation 815. A side view 813 of the TiN SC-NPC nanostructure 810 illustrates the exemplary height of the stub formation 815.

The TiN SC-NPC nanostructure 810 may be formed and have dimensions similar to the TiN SC-NPC nanostructure 800 of FIG. 8A. Instead of a nanohole 805, the TiN SC-NPC nanostructure 810 includes a stub formation 815. The stub formation 815 may, for example, have a length of 10 asymmetric units, a width of 4 asymmetric units, and a thickness of 1 asymmetric unit. More generally, the stub formation may be rectangular with a length of A asymmetric units of the superconductor material, a width of B asymmetric units of the superconductor material, and a thickness of C asymmetric units of the superconductor material, where each of A, B, and C are integer values with $\leq(X-2)$, $B \leq (Y-2)$, and $C \geq 1$.

Figure 8C:
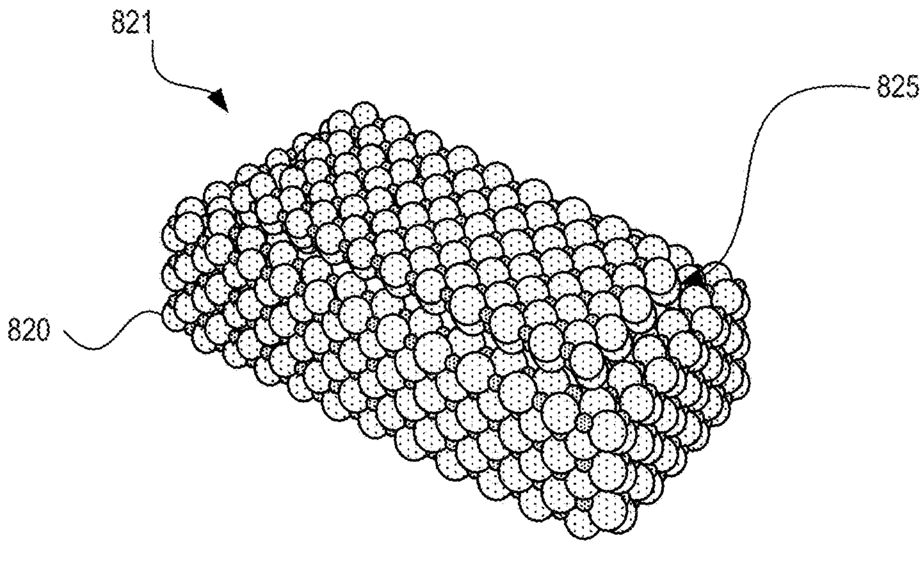
FIG. 8C illustrates an example of an SC-NPC nanostructure with an internal nanohole and a stub formation, according to one embodiment.
Figure 8C:
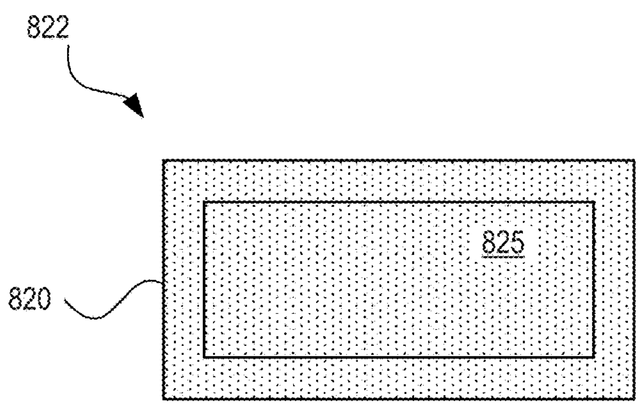
Figure 8C:
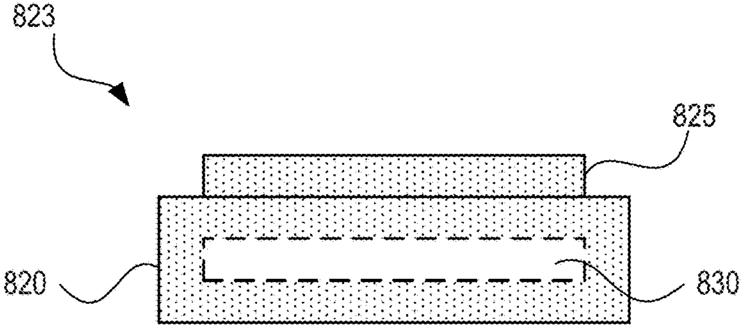

FIG. 8C illustrates an example of a TiN SC-NPC nanostructure 820 with an internal nanohole 830 and a stub formation 825, according to one embodiment. A perspective view 821, a top-down view 822, and a side view 823 are provided to illustrate the internal nanohole 830 and stub formation 825. The TiN SC-NPC nanostructure 820 may be formed and have dimensions similar to the TiN SC-NPC nanostructure 800 and the TiN SC-NPC nanostructure 810 of FIGS. 8A and 8B, respectively. The stub formation 825 may be formed and have dimensions similar to the stub formation 815 of FIG. 8B. The internal nanohole 830 may have dimensions that are less than those of the TiN SC-NPC nanostructure 820. As such, the sidewalls of the TiN SC-NPC nanostructure 820 form a shell around the internal nanohole 830.

Figure 8D:
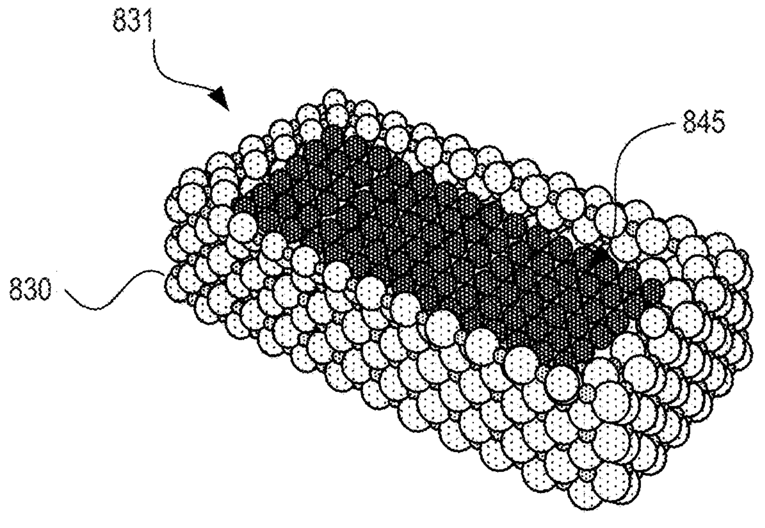
FIG. 8D illustrates an example of an SC-NPC nanostructure of a first superconductor material with a nanohole filed with a second superconductor material, according to one embodiment.
Figure 8D:
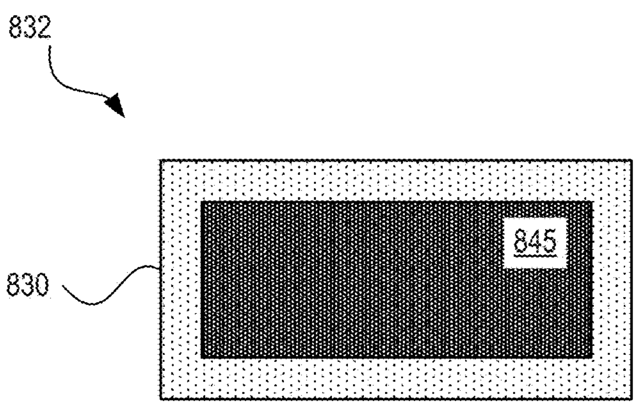
Figure 8D:
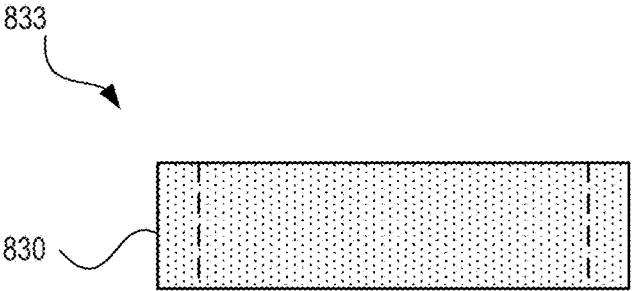

FIG. 8D illustrates an example of a TiN SC-NPC nanostructure 830 of a first superconductor material (e.g., TiN) with a nanohole filed with a second superconductor material 845 (e.g., Al), according to one embodiment. A perspective view 831, a top-down view 832, and a side view 833 are provided to illustrate the nanohole filled with the second superconductor material, a metal, or another material. The TiN SC-NPC nanostructure 830 and its nanohole may be formed and have dimensions similar to the TiN SC-NPC nanostructure 800 of FIG. 8A.

The perspective view 831 of the TiN SC-NPC nanostructure 830 includes a representation of the asymmetric units of paired titanium and nitrogen atoms forming the walls of the TiN SC-NPC nanostructure 830. The top-down view 832 illustrates a top view of the sidewalls of the TiN SC-NPC nanostructure 830 with the rectangular nanohole filled with the second superconductor material 845. A side view 833 of the TiN SC-NPC nanostructure 830 includes dashed lines showing the internal location of the nanohole. According to various embodiments, the SC-NPC may be formed from any one of niobium disulfide ($NbS_2$), titanium nitride (TiN), niobium nitride (NbN), niobium-titanium nitride (NbTiN), magnesium diboride ($MgB_2$), niobium carbine (NbC), niobium diselenide ($NbSe_2$). In any of the forging embodiments, the nanohole may be filed with one or more of comprises one or more of aluminum (Al), niobium disulfide ($NbS_2$), titanium (Ti), niobium (Nb), titanium nitride (TiN), niobium nitride (NbN), niobium-titanium nitride (NbTiN), magnesium diboride ($MgB_2$), niobium carbine (NbC), niobium diselenide ($NbSc_2$).

Figures 9A, 9B:
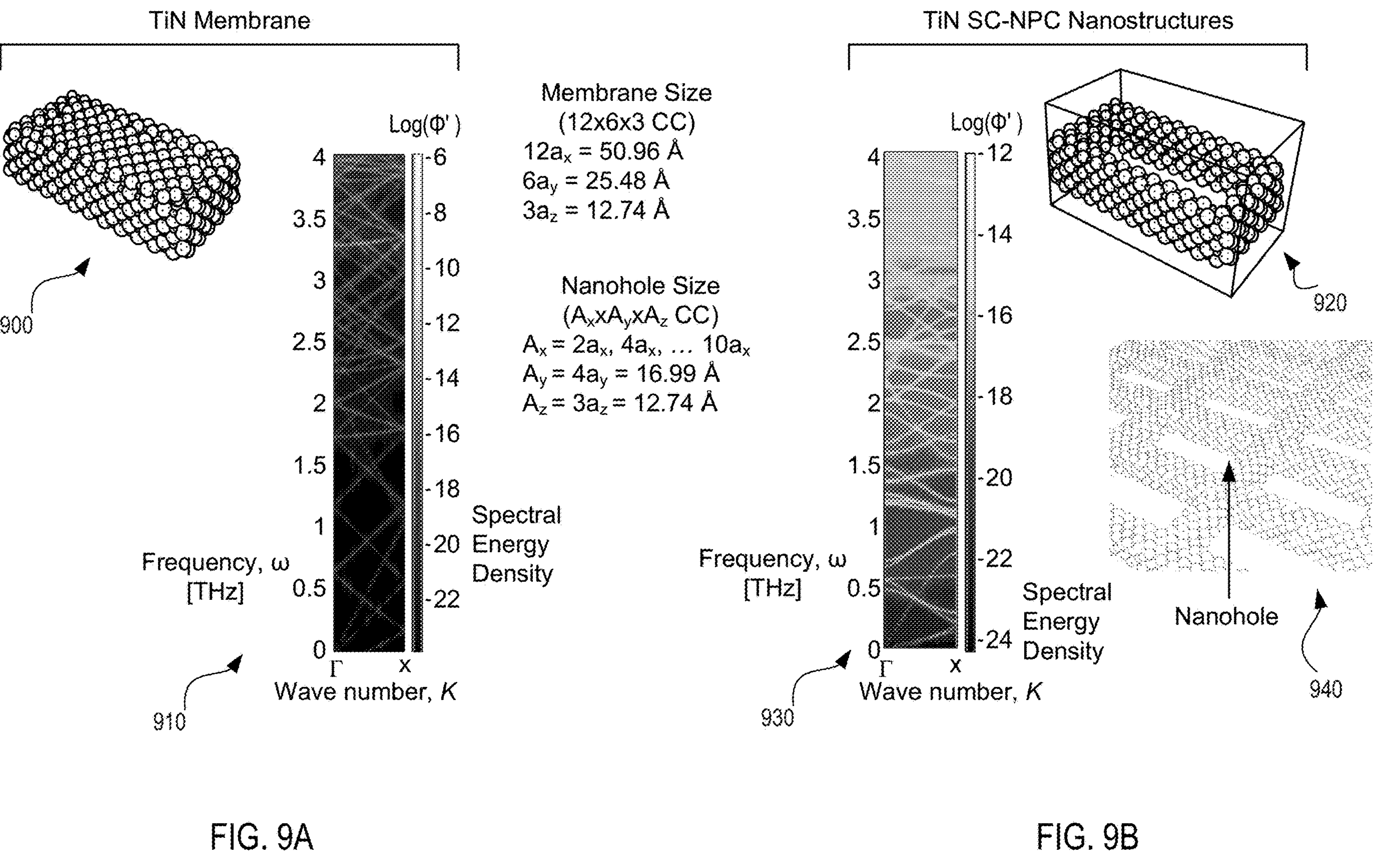
FIG. 9A illustrates a phonon dispersion plot for a superconductor material without nanostructures, according to one embodiment.
FIG. 9B illustrates a phonon dispersion plot for a superconductor metamaterial of SC-NPC nanostructures with nanoholes, according to one embodiment.

FIG. 9A illustrates a phonon dispersion plot 910 for a TiN superconductor material 900 without nanostructures, according to one embodiment. A conventional cell (CC) of the TiN superconductor material 900 exhibits relatively high spectral energy density at higher frequencies.

FIG. 9B illustrates a phonon dispersion plot 930 for a superconductor metamaterial 940 formed with a plurality of TiN SC-NPC nanostructures 920, according to one embodiment. As illustrated, each of the TiN SC-NPC nanostructures 920 comprises a three-dimensional lattice of the superconductor material with a nanohole formed therein. As illustrated in the phonon dispersion plot 930, the spectral energy density is higher at lower frequencies, as compared to the unmodified TiN superconductor material 900 of FIG. 9A. The structurally engineered TiN SC-NPC nanostructures 920 operate to increase electron-phonon coupling for the phonon mode, resulting in the superconductor metamaterial 940 having a higher critical temperature than the unmodified form of the TiN superconductor material 900.

Figure 9D:
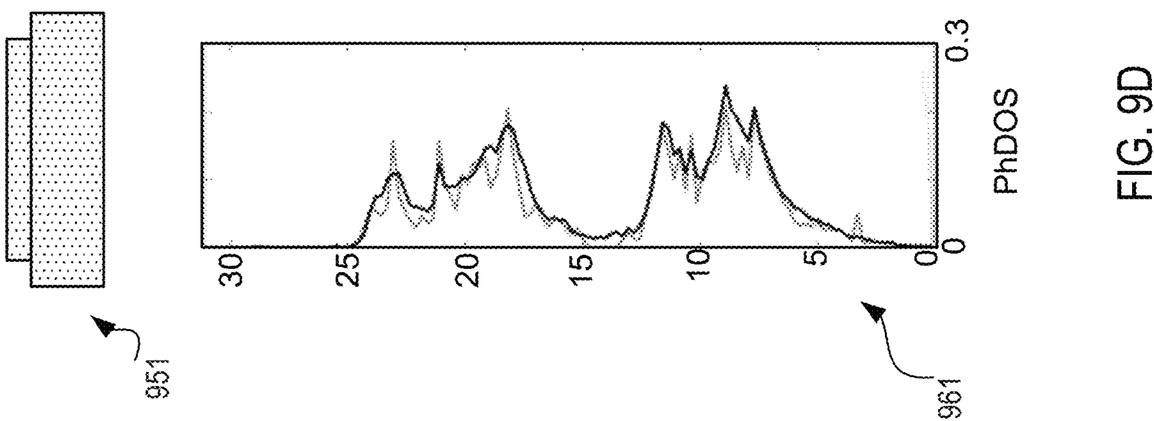
FIG. 9D illustrates a graph of the phonon density of states (DOS) for the SC-NPC nanostructures with stub formations, according to one embodiment.
Figure 9C:
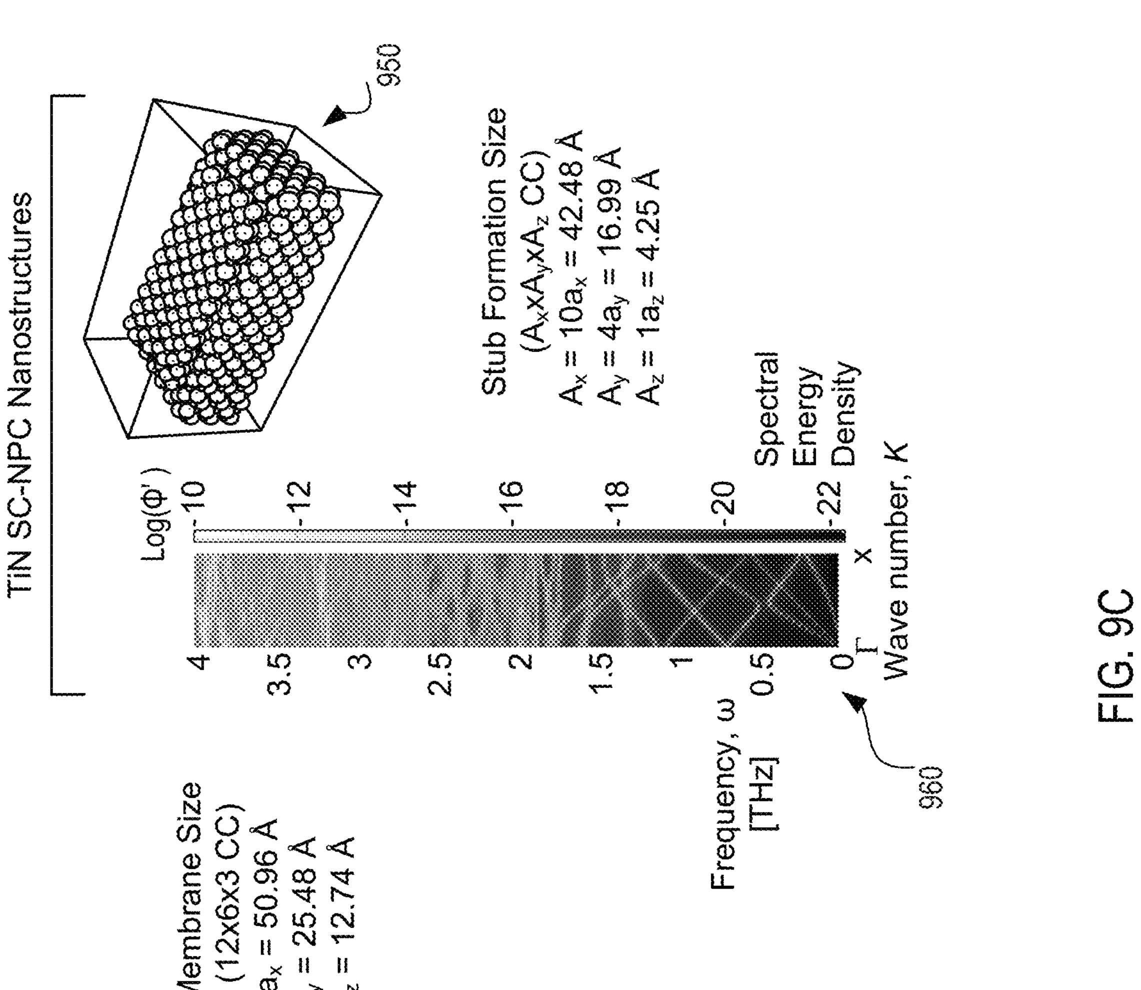
FIG. 9C illustrates a phonon dispersion plot for a superconductor metamaterial of SC-NPC nanostructures with stub formations, according to one embodiment.

FIG. 9C illustrates a phonon dispersion plot 960 for a superconductor metamaterial of TiN SC-NPC nanostructures 950, according to one embodiment. As illustrates, each of the TiN SC-NPC nanostructures 950 is structurally modified to have a stub formation, similar to the TiN SC-NPC nanostructures 810 and stub formation 815 of FIG. 8B, according to one embodiment. As illustrated in the phonon dispersion plot 960, the spectral energy density is higher at lower frequencies, as compared to the unmodified TiN superconductor material 900 of FIG. 9A. The structurally engineered TiN SC-NPC nanostructures 950 operate to increase electron-phonon coupling for the phonon mode, resulting in the superconductor metamaterial having a higher critical temperature than the unmodified form of the TiN superconductor material 900.

FIG. 9D illustrates a side view 951 of the TiN SC-NPC nanostructure 950. Additionally, a graph 961 illustrates the phonon density of states (DOS) for a superconductor metamaterial formed with a plurality of the SC-NPC nanostructures 951 structurally modified to have stub formations, according to one embodiment. As illustrated by the darker line, the phonon DOS of the superconductor metamaterial is modified and different than the phonon DOS of the unmodified bulk from of the superconductor material (shown with a lighter line).

FIGS. 10A-F illustrates phonon dispersion plots for superconductor metamaterial of SC-NPC nanostructures with nanoholes having various dimensions, according to one embodiment. The depicted TiN SC-NPC nanostructures and nanoholes are not necessarily drawn to scale. The phonon dispersion plots of the phonon band structures are computed and/or modeled using empirical models to determine the influence of the nanohole size and spacing on the phonon DOS in supercell samples comprising 5×5×5 conventional cells (CCs) with nanoholes of varying sizes.

Figures 10A, 10B, 10C:
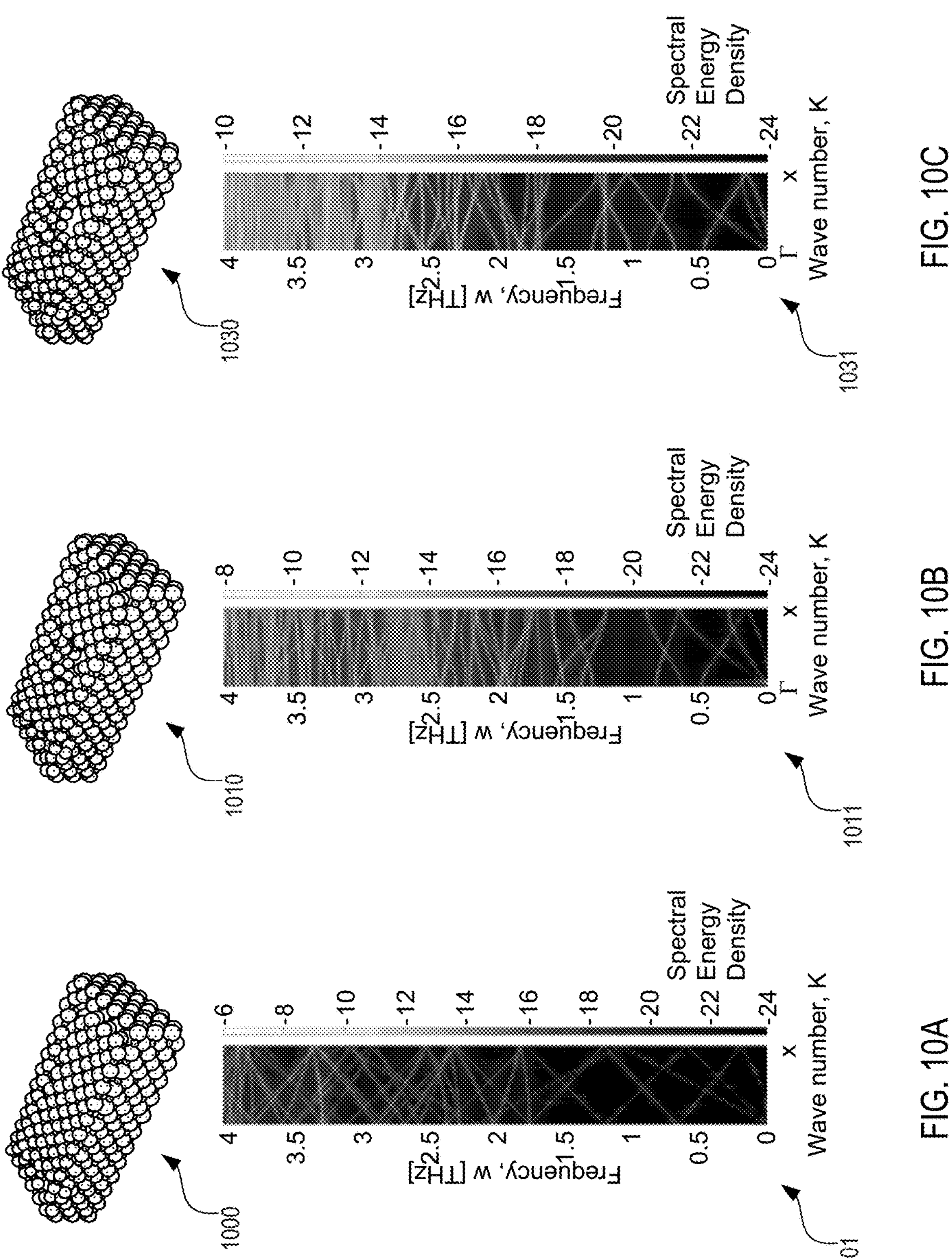
FIGS. 10A-F illustrates phonon dispersion plots for superconductor metamaterial of SC-NPC nanostructures with nanoholes having various dimensions, according to one embodiment.

FIG. 10A illustrates a phonon dispersion plot 1001 for an unmodified TiN superconductor material formed from a plurality (e.g., a 5×5×5 arrangement) of conventional cells 1000 of TiN, according to one embodiment. The phonon band structure of the conventional cells of the superconductor material may be calculated, simulated, or estimated. For example, the phonon band structure may be calculated from first principles.

FIG. 10B illustrates a phonon dispersion plot 1011 for a superconductor metamaterial formed from a plurality of TiN SC-NPC nanostructures 1010. In the illustrated embodiment, each TiN SC-NPC nanostructure 1010 has a relatively small nanohole passing through the width thereof. The length of the nanohole is only two asymmetric units, leaving end walls that are five asymmetric units thick. The width of the nanohole is four asymmetric units, such that the sidewalls have a thickness of 1 asymmetric unit. The illustrated embodiment results in a modest increase in energy density between 2 and 4 THz within the phonon mode. The changes to the phonon band structure are due to the nanohole, which modifies the phonon DOS distribution. A favorable drop in the frequency distribution of the density of states (DOS) corresponds to shifts to lower frequencies and, consequently, increases in the density of states at lower frequencies.

FIG. 10C illustrates a phonon dispersion plot 1031 for a superconductor metamaterial formed from a plurality of TiN SC-NPC nanostructures 1030. In the illustrated embodiment, each TiN SC-NPC nanostructure 1030 has a slightly larger nanohole passing through the width thereof. The length and width of the nanohole are each four asymmetric units, leaving end walls that are four asymmetric units thick and sidewalls that have a thickness of 1 asymmetric unit. The illustrated embodiment results in an additional increase in the density of states between 2 and 4 THz within the phonon mode.

Figure 10F:
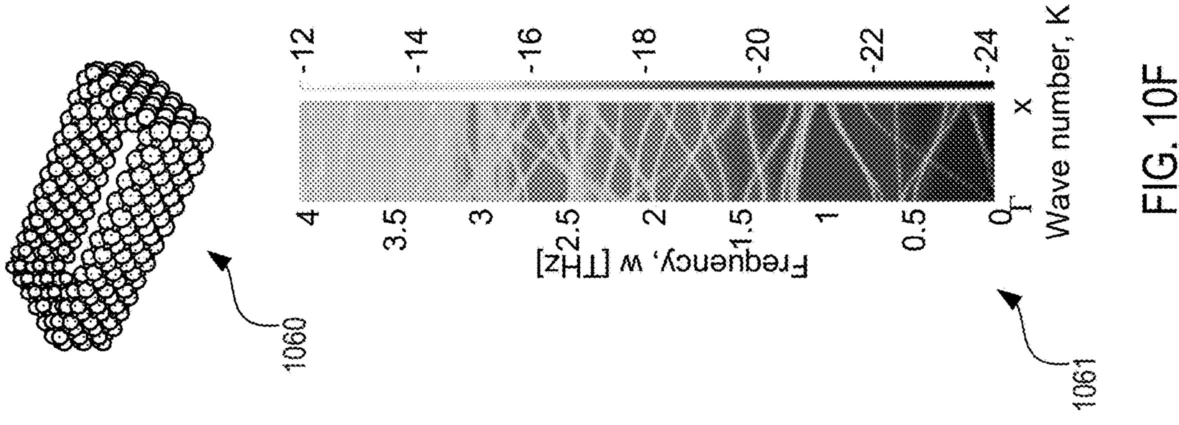
Figure 10E:
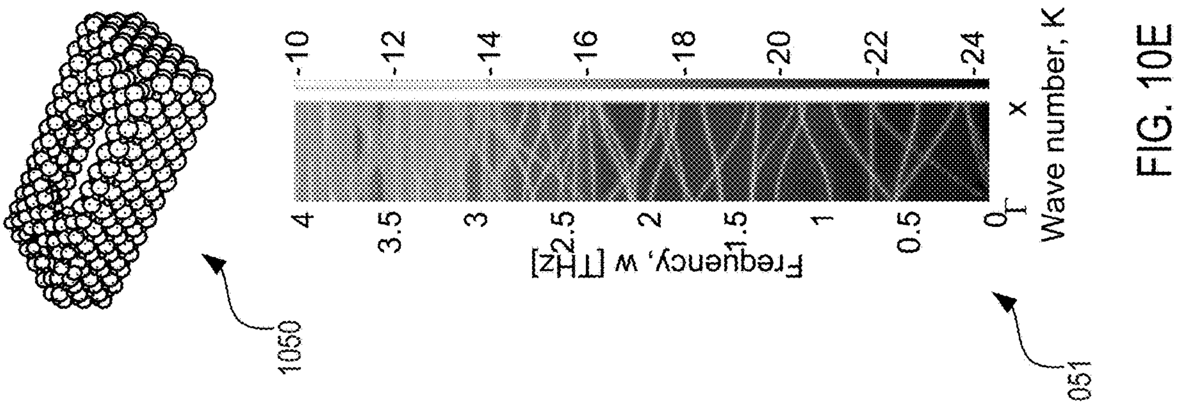
Figure 10D:
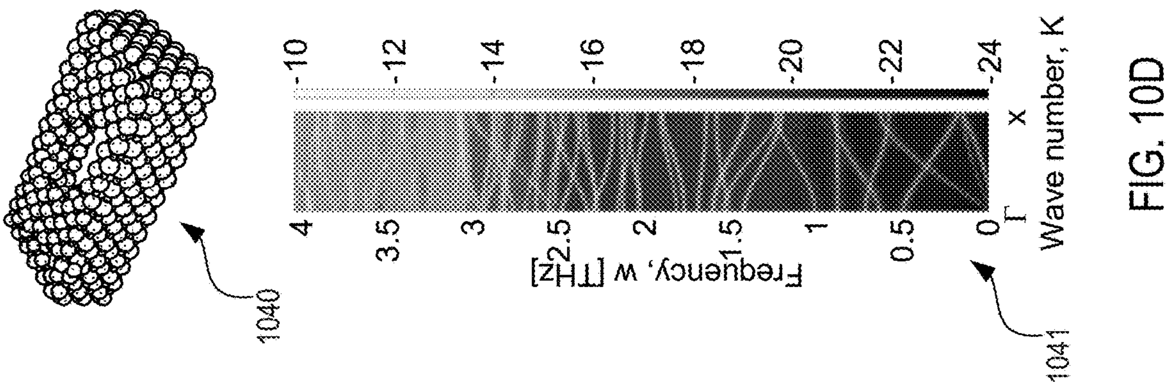

FIG. 10D illustrates a phonon dispersion plot 1041 for a superconductor metamaterial formed from a plurality of TiN SC-NPC nanostructures 1040. In the illustrated embodiment, each TiN SC-NPC nanostructure 1040 has an even larger nanohole passing through the width thereof. The length of the nanohole is six asymmetric units, leaving end walls that are three asymmetric units thick. The width of each nanohole remains the same at four asymmetric units, and the sidewalls have a thickness of 1 asymmetric unit. The illustrated embodiment results in an additional increase in energy density between approximately 1.5 and 4 THz within the phonon mode.

FIG. 10E illustrates a phonon dispersion plot 1051 for a superconductor metamaterial formed from a plurality of TiN SC-NPC nanostructures 1050. In the illustrated embodiment, each TiN SC-NPC nanostructure 1050 has a nanohole passing through the width thereof with a length of 8 asymmetric units and a width of 4 asymmetric units. As such, the end walls are two asymmetric units thick, and the sidewalls are one asymmetric unit thick. The illustrated embodiment results in an additional increase in energy density at lower frequencies within the phonon mode.

FIG. 10F illustrates a phonon dispersion plot 1061 for a superconductor metamaterial formed from a plurality of TiN SC-NPC nanostructures 1060. In the illustrated embodiment, each TiN SC-NPC nanostructure 1060 has a nanohole passing through the width thereof with a length of 10 asymmetric units and a width of 4 asymmetric units. As such, the end walls and sidewalls form a shell on all four sides that is only one asymmetric unit thick. The illustrated embodiment results in a significant increase in energy densities throughout the phonon mode, including at lower frequencies between 0.5 and 4 THz.

According to various embodiments, the SC-NPC nanostructures are structurally engineered at the quantum level to achieve a target change in the phonon density of states (phDOS) with respect to the underlying or base superconductor material. The phonon population relevant to superconductivity spans the terahertz regime. Accordingly, direct atomistic modeling incorporating harmonic lattice dynamics calculations may be utilized. The intrinsic properties of SC-NPC nanostructures formed from a selected or target superconductor material are engineered (e.g., with structural modifications to a crystal lattice) to provide the desired properties uniformly across the sample and/or in a local spot. The engineering process can leverage a comparison of the phonon band structure of a conventional cell (CC) for the target superconductor material with the same calculations conducted using the Modified Embedded Atom Method with well-researched empirical potentials.

Figures 11A, 11B:
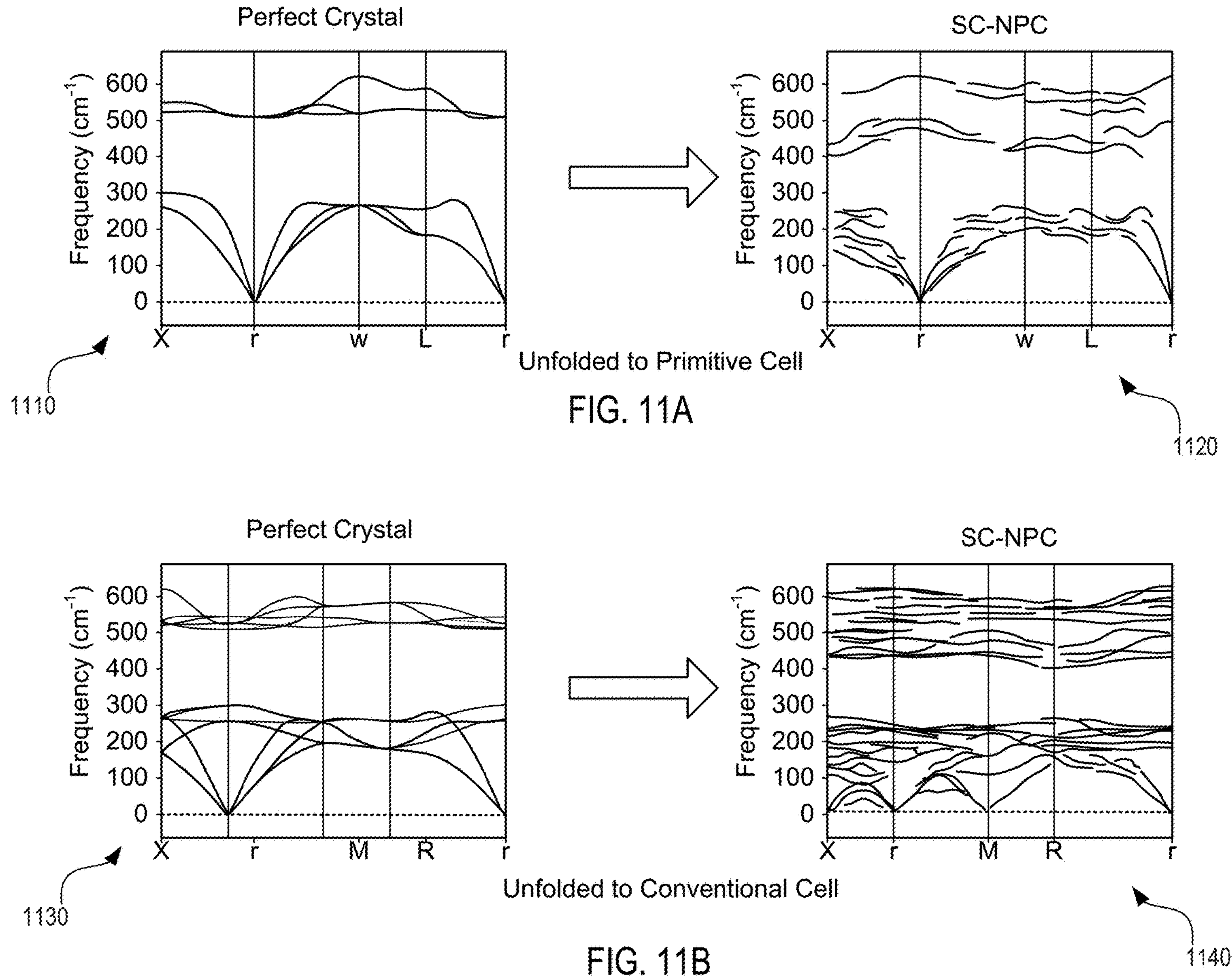
FIG. 11A illustrates the phonon spectra of a perfect crystal TiN SC-NPC nanostructure unfolded to a primitive cell, according to one embodiment.
FIG. 11B illustrates the phonon spectra of a perfect crystal TiN SC-NPC nanostructure unfolded to a conventional cell, according to one embodiment.

FIG. 11A illustrates the phonon spectra of a perfect crystal TiN SC-NPC nanostructure 1110 unfolded to a primitive cell 1120, according to one embodiment. The unfolded primitive cell 1120 illustrates the modifications to the phonon band structure attainable by using a superconductor metamaterial of SC-NPC nanostructures.

FIG. 11B illustrates the phonon spectra of a perfect crystal TiN SC-NPC nanostructure 1130 unfolded to a conventional cell 1140, according to one embodiment. The unfolded conventional cell 1140 again illustrates the modifications to the phonon band structure attainable by using a superconductor metamaterial of SC-NPC nanostructures.

Figure 12:
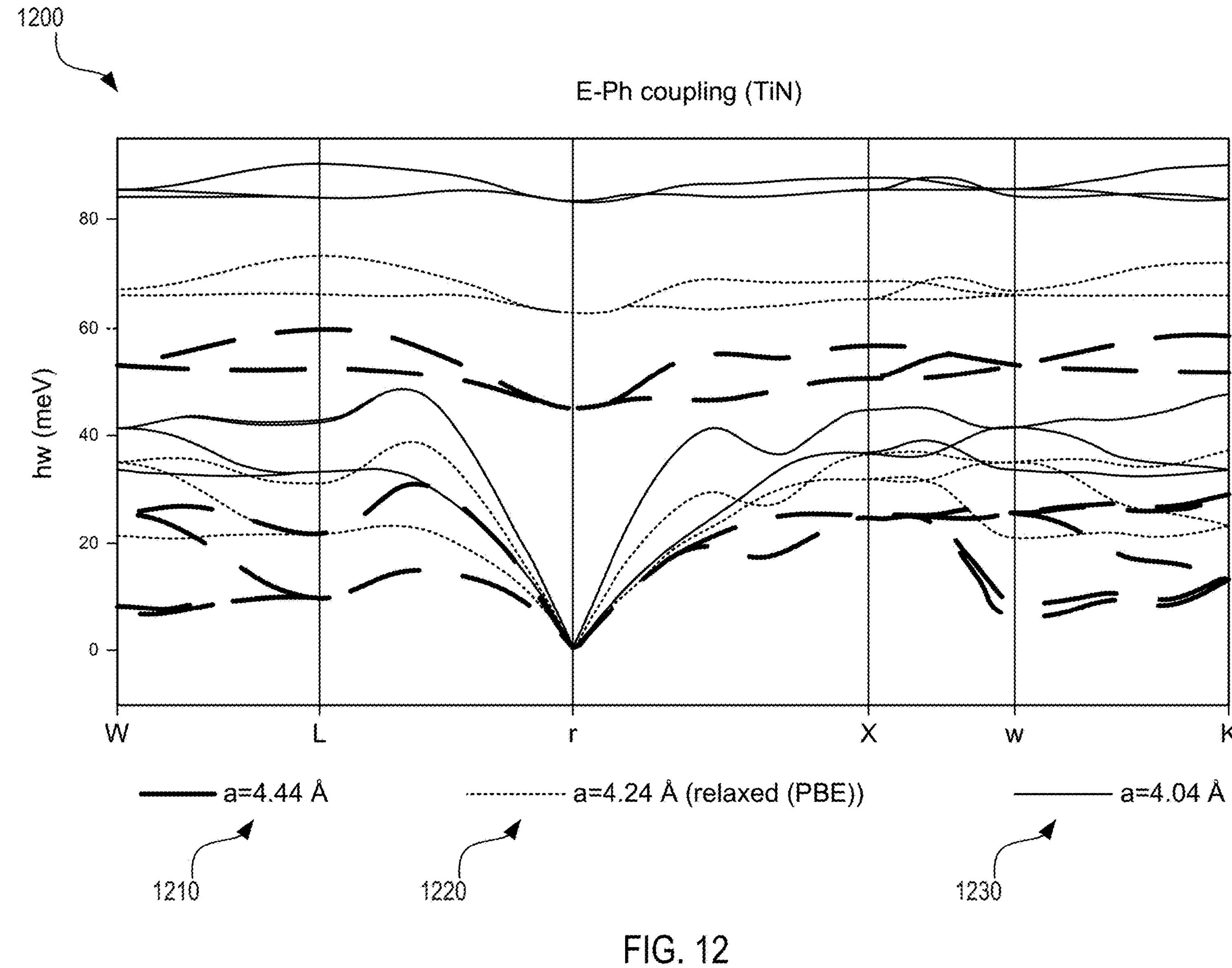
FIG. 12 illustrates the electron-phonon coupling of superconductor metamaterials as a function of nanohole dimension in the TiN SC-NPC nanostructures, according to one embodiment.

FIG. 12 illustrates a graph 1200 of the electron-phonon coupling of superconductor metamaterials as a function of nanohole dimension in the TiN SC-NPC nanostructures, according to one embodiment. The graph 1200 illustrates the coupling strength (shown by thicker lines and closely positioned lines with the same dashed pattern) for SC-NPC nanostructures with nanoholes having three different sizes, 4.44 Å, at 1210, 4.24 Å (relaxed PBE), at 1220, and 4.04 Å, at 1230. This data can be combined with the data in the graphs of FIGS. 11A and 11B to calculate the critical temperature for superconductor metamaterials formed with SC-NPC nanostructures with different-sized nanoholes.

Figure 13A:
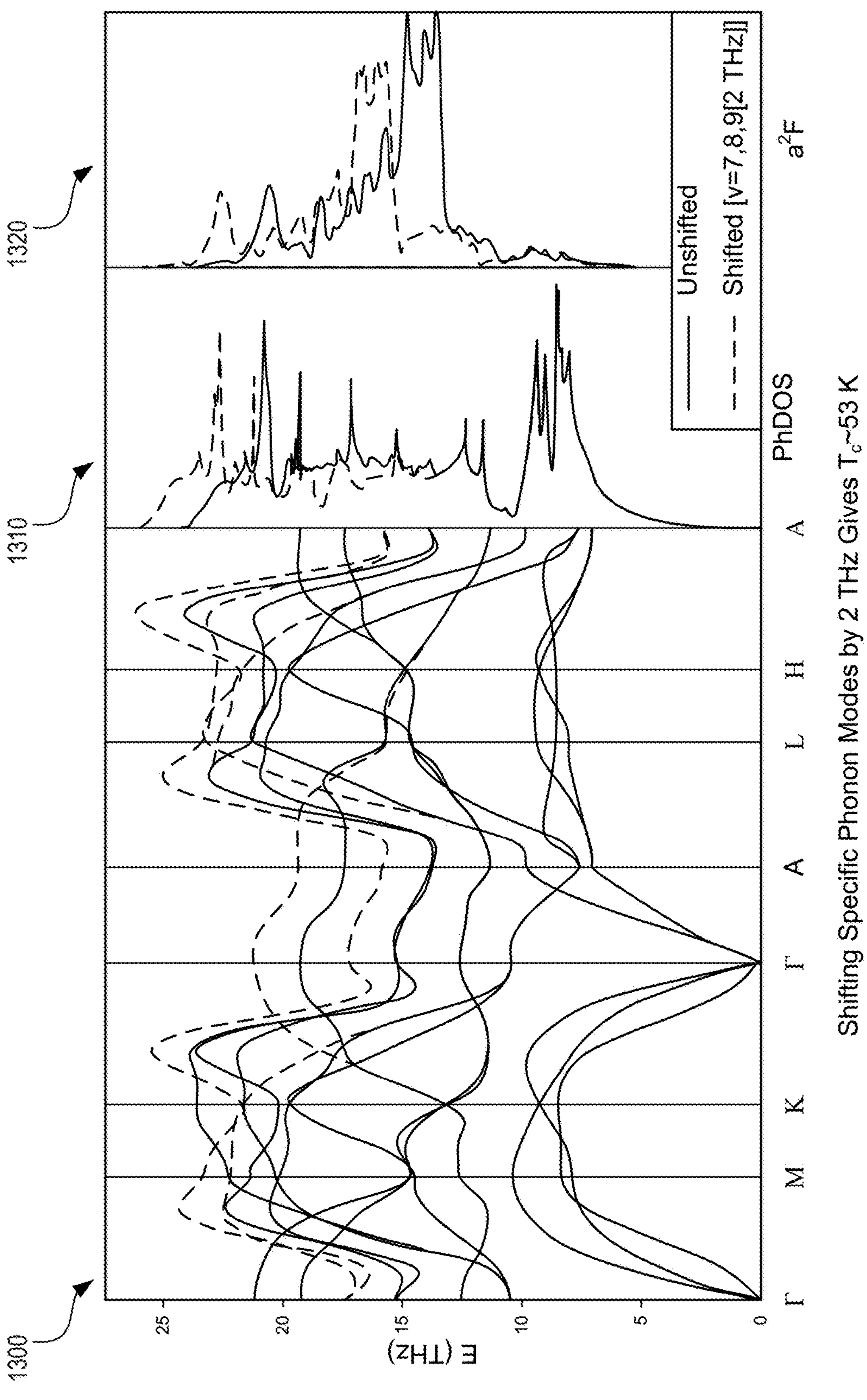
FIG. 13A illustrates a reshaped phonon spectrum of a magnesium diboride ($MgB_2$)-based superconductor metamaterial, according to one embodiment.

FIG. 13A illustrates a graph 1300 of a reshaped phonon spectrum of a $MgB_2$-based superconductor metamaterial, according to one embodiment. A graph 1310 of the phonon DOS and a graph 1320 of the energy with respect to the Eliashberg functions for each phonon mode are also illustrated. According to various embodiments, the $MgB_2$-based superconductor metamaterial is formed with a plurality of SC-NPC nanostructures of $MgB_2$. Each SC-NPC nanostructure comprises a crystal (e.g., a conventional cell) of the $MgB_2$ superconductor material with at least one structural modification that alters a characteristic of a phonon mode of the $MgB_2$ superconducting material. The altered phonon modes correspond to enhancements in one or more superconducting parameters. Any of the structural modifications described herein may be utilized in conjunction with the $MgB_2$ SC-NPC nanostructures. As illustrated, shifting the higher-order phonon nodes by 2 THz increases the critical temperature of the $MgB_2$-based superconductor metamaterial to approximately 53 Kelvin.

Figure 13B:
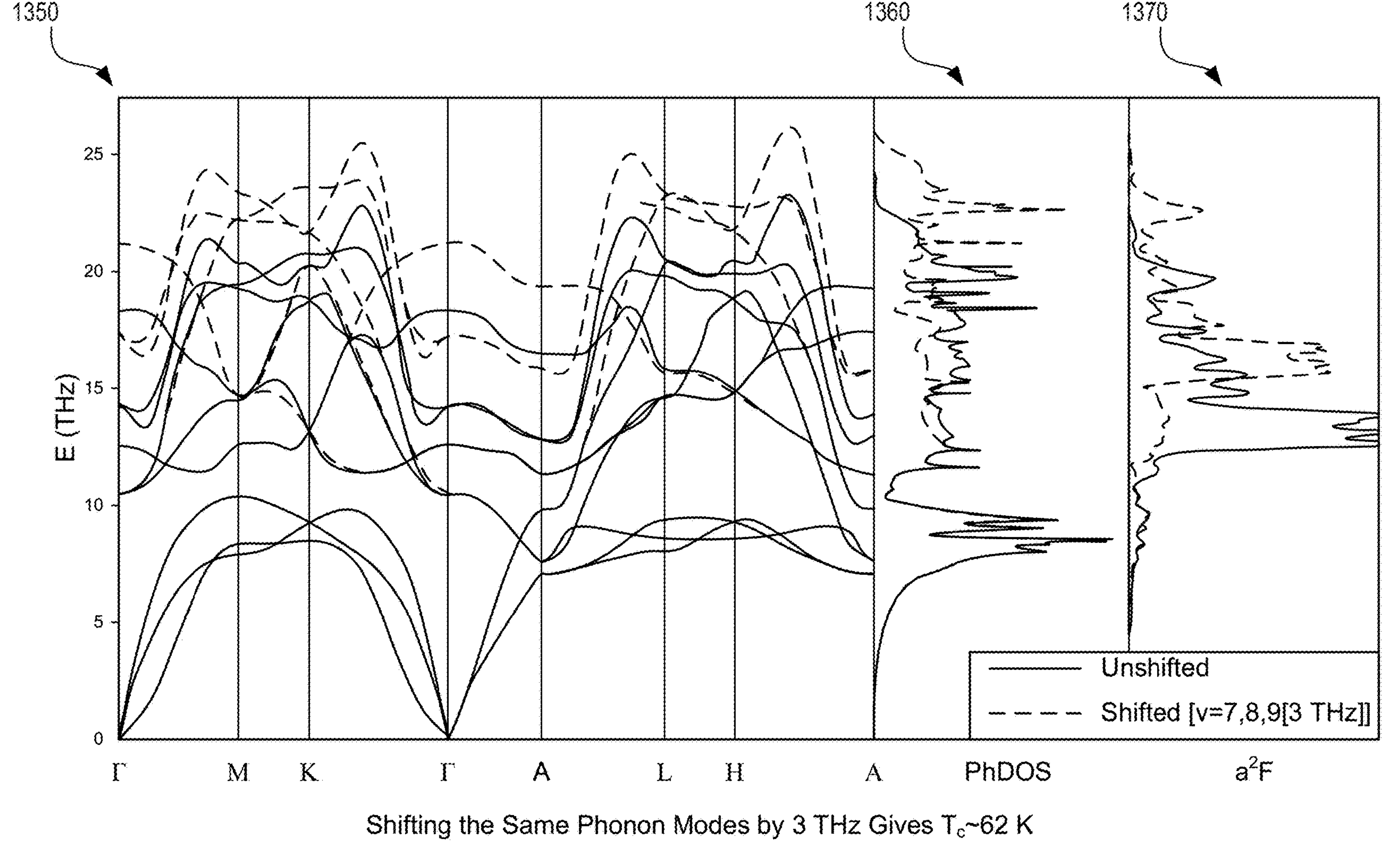
FIG. 13B illustrates another reshaped phonon spectrum of a $MgB_2$-based superconductor metamaterial, according to one embodiment.

FIG. 13B illustrates a graph 1350 of a reshaped phonon spectrum of a $MgB_2$-based superconductor metamaterial, according to another embodiment. A graph 1360 of the phonon DOS and a graph 1370 of the energy with respect to the Eliashberg functions for each phonon mode are also illustrated. As illustrated, the shifting (e.g., decreasing or lowering) the higher order phonon nodes by 3 THz increases the critical temperature of the $MgB_2$-based superconductor metamaterial to approximately 62 Kelvin.

Figure 14:
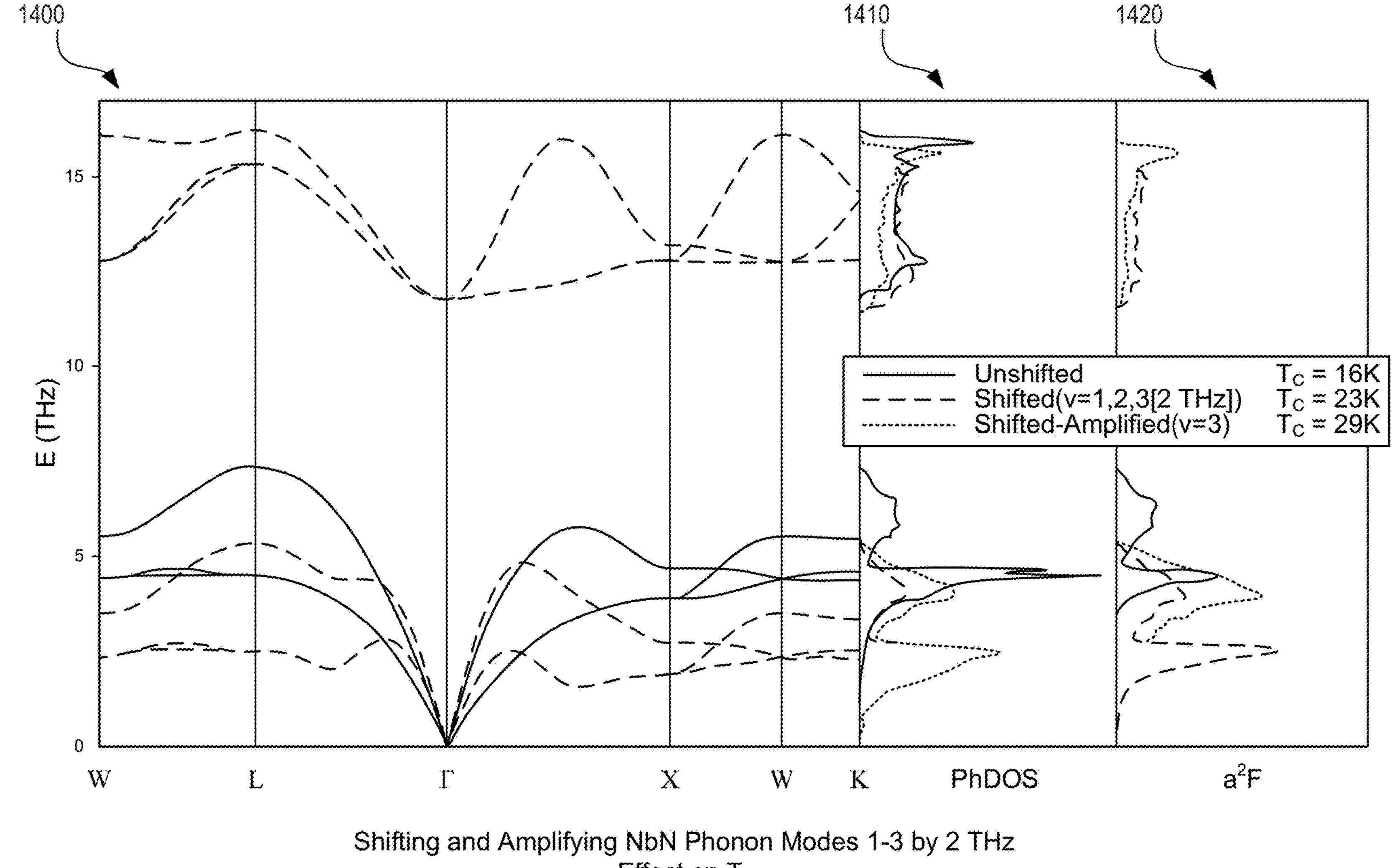
FIG. 14 illustrates a reshaped phonon spectrum of a niobium nitride (NbN)-based superconductor metamaterial, according to one embodiment.

FIG. 14 illustrates a graph 1400 of a reshaped phonon spectrum of an NbN-based superconductor metamaterial, according to one embodiment. A graph 1410 of the phonon DOS and a graph 1420 of the energy with respect to the Eliashberg functions for each phonon mode are also illustrated. Shifting phonon nodes 1-3 by 2 THz and amplifying the first phonon node increases the critical temperature of the NbN-based superconductor metamaterial from 16 Kelvin to approximately 29 Kelvin. Only shifting phonon nodes 1-3 by 2 THz (without amplification) increases the critical temperature of the NbN-based superconductor metamaterial from 16 Kelvin to approximately 23 Kelvin.

According to various embodiments, the NbN-based superconductor metamaterial is formed with a plurality of SC-NPC nanostructures of NbN. Each SC-NPC nanostructure comprises a crystal (e.g., a conventional cell) of the NbN superconductor material with at least one structural modification that alters a characteristic of a phonon mode of the NbN superconducting material. Any of the structural modifications described herein may be utilized in conjunction with the NbN SC-NPC nanostructures.

Figure 15:
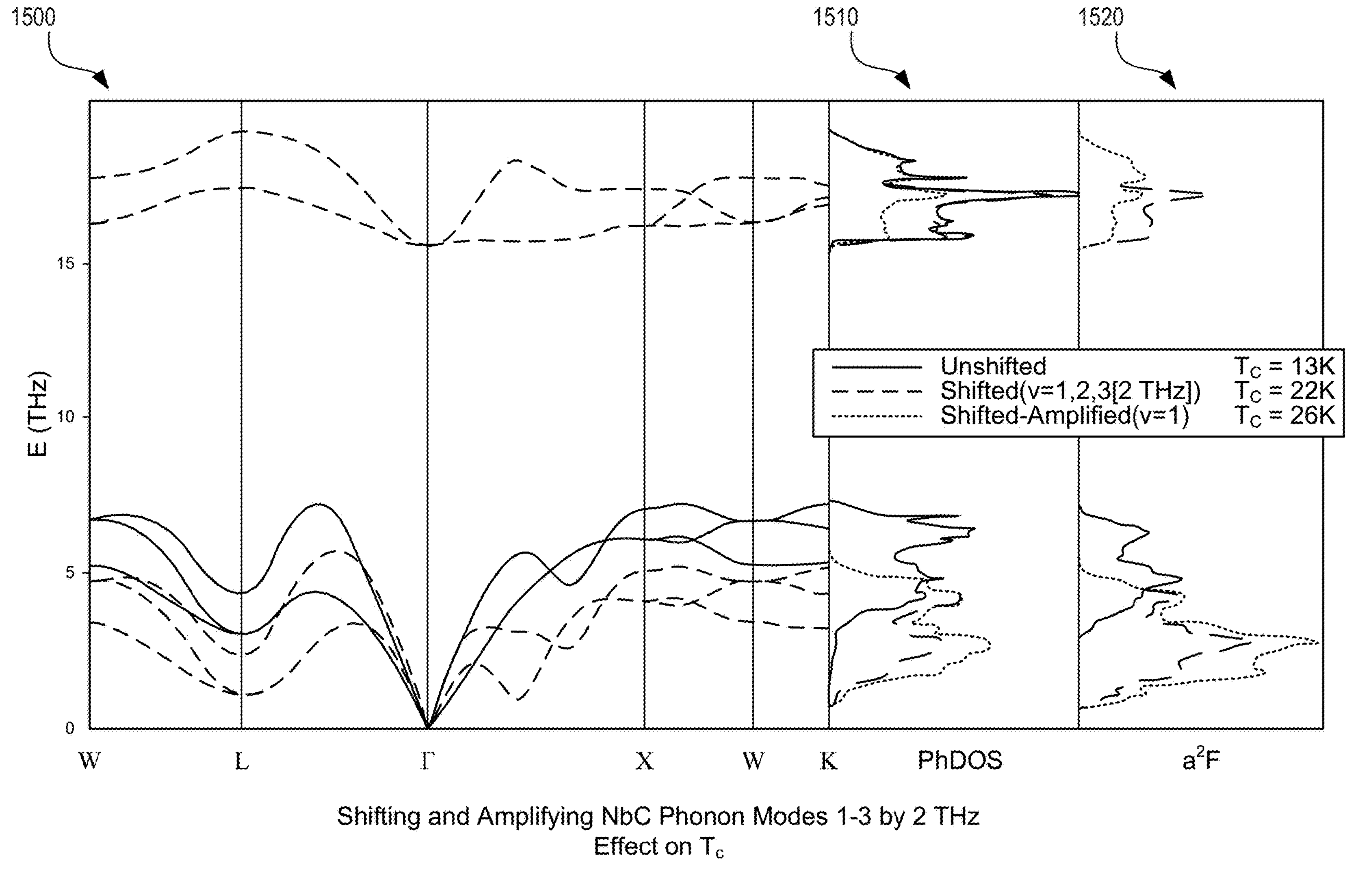
FIG. 15 illustrates a reshaped phonon spectrum of a niobium carbine (NbC)-based superconductor metamaterial, according to one embodiment.

FIG. 15 illustrates a graph 1500 of a reshaped phonon spectrum of an NbC-based superconductor metamaterial, according to one embodiment. A graph 1510 of the phonon DOS and a graph 1520 of the energy with respect to the Eliashberg functions for each phonon mode are also illustrated. Shifting phonon nodes 1-3 by 2 THz and amplifying the first phonon mode increases the critical temperature of the NbC-based superconductor metamaterial from 13 Kelvin to approximately 22 Kelvin. Only shifting phonon nodes 1-3 by 2 THz (without amplification) increases the critical temperature of the NbC-based superconductor metamaterial from 13 Kelvin to approximately 26 Kelvin.

As in other embodiments, the NbC-based superconductor metamaterial is formed with a plurality of SC-NPC nanostructures of NbC. Each SC-NPC nanostructure comprises a crystal (e.g., a convention cell) of the NbC superconductor material with at least one structural modification that alters a characteristic of a phonon mode of the NbC superconducting material. Any of the structural modifications described herein may be utilized in conjunction with the NbC SC-NPC nanostructures.

Figure 16:
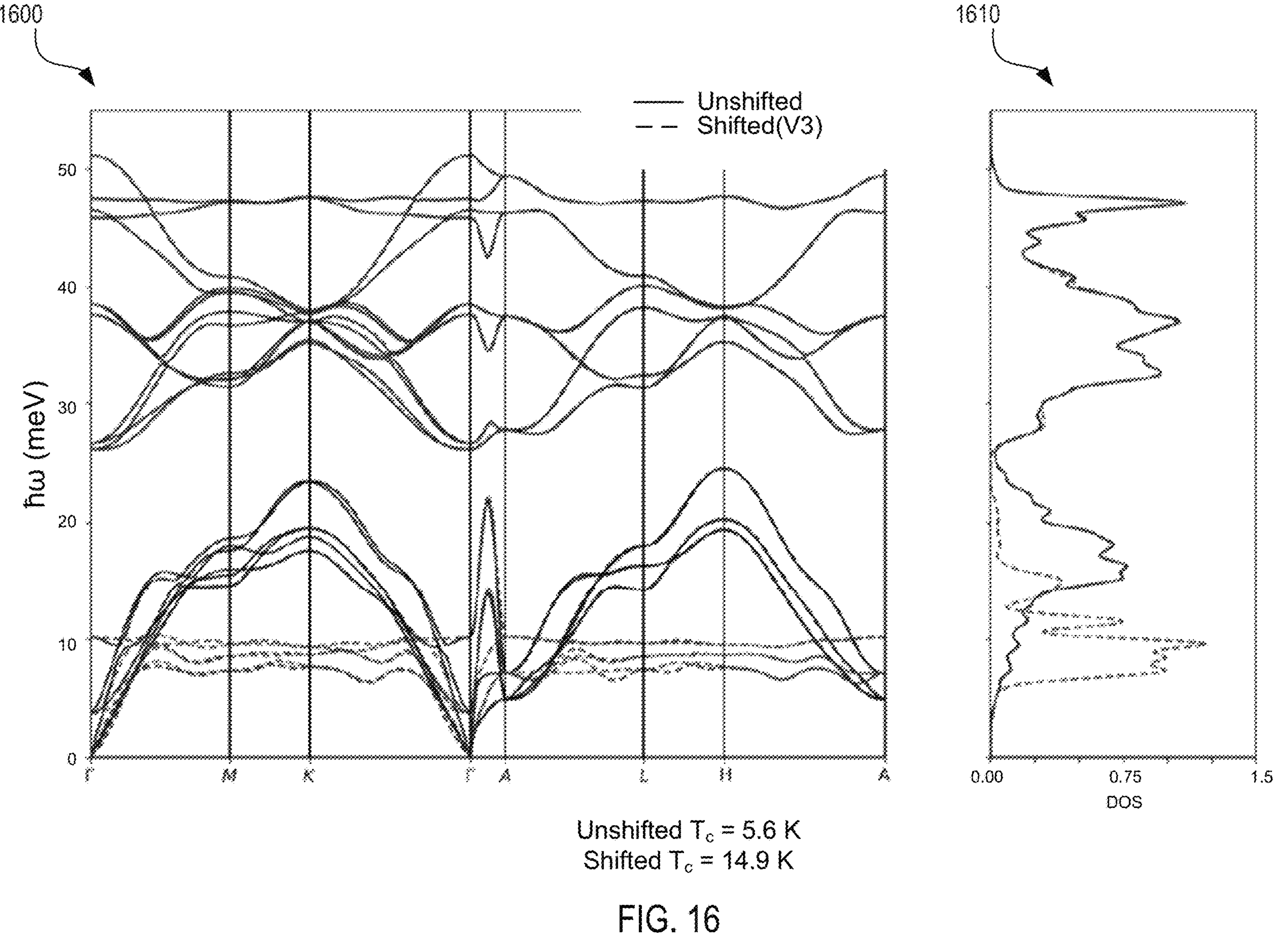
FIG. 16 illustrates a reshaped phonon spectrum of a niobium disulfide ($NbS_2$)-based superconductor metamaterial, according to one embodiment.

FIG. 16 illustrates a graph 1600 of a reshaped phonon spectrum of a $NbS_2$-based superconductor metamaterial, according to one embodiment. A graph 1610 of the phonon DOS for each phonon mode is also illustrated. According to various embodiments, the $NbS_2$-based superconductor metamaterial is formed with a plurality of SC-NPC nanostructures of $NbS_2$ superconductor material with at least one structural modification that alters a characteristic of a phonon mode of the $NbS_2$ superconducting material. The altered phonon modes correspond to enhancements in one or more superconducting parameters. Any of the structural modifications described herein may be utilized in conjunction with the $NbS_2$ SC-NPC nanostructures (e.g., nanoholes, empty nanoholes, filled nanoholes, stubs, combinations thereof, various patterns of sizes or types of nanoholes and stubs, etc.). As illustrated, the frequency-shifted phonon nodes increase the critical temperature of the $NbS_2$-based superconductor metamaterial from 5.6 K to 14.9 K.

The systems, devices, materials, manufacturing techniques, and methods disclosed herein are related to, build upon, and may utilize aspects of the systems, devices, materials, manufacturing techniques, and methods found in the following publications, which are understood by those of skill in the art and incorporated herein in their entireties to the extent allowed by law: Chen, H., Taylor, A. J. & Yu, N. A review of metasurfaces: physics and applications. *Reports on Progress in Physics* 79, 76401 (2015); DOE BES. *Quantum Materials for Energy Relevant Technology*. http://science.energy.gov/bes/community-resources/reports/(2017); Hussein, M. I., Leamy, M. J. & Ruzzene, M. Dynamics of phononic materials and structures: Historical origins, recent progress, and future outlook. *Appl Mech Rev* 66, 040802 (2014); Maldovan, M. Phonon wave interference and thermal bandgap materials. *Nat Mater* 14, 667-674 (2015); Keimer, B., Kivelson, S. A., Norman, M. R., Uchida, S. & Zaanen, J. From quantum matter to high-temperature superconductivity in copper oxides. *Nature* 518, 179-186 (2015); Si, Q. & Hussey, N. E. Iron-based superconductors: Teenage, complex, challenging. *Phys Today* 76, 34 (2023); Drozdov, A. P. et al. Superconductivity at 250 K in lanthanum hydride under high pressures. *Nature* 569, 528 (2019); Cohen, R. W. & Abeles, B. Superconductivity in granular aluminum films. *Physical Review* 168, 444 (1968); Kohopää, K. et al. Wafer-scale method for amorphizing superconducting thin films. *ArXiv* (2023); Smolyaninov, I. I. & Smolyaninova, V. N. Metamaterial superconductors. *Nanophotonics* 7, 795-818 (2018); Allan, M. P., Fischer, M. H., Ostojic, O. & Andringa, A. Creating better superconductors by periodic nanopatterning. *SciPost Physics* 3, (2017); Smolyaninov, I. I. & Smolyaninova, V. N. Metamaterial superconductors. *Phys. Rev. B* 91, 094501 (2015); Pickett, W. E. Room Temperature Superconductivity: the Roles of Theory and Materials Design. *Rev Mod Phys* (2022); Davis, B. L. & Hussein, M. I. Thermal characterization of nanoscale phononic crystals using supercell lattice dynamics. *AIP Adv* 1, 041701 (2011; Spann, B. T. et al. Semiconductor Thermal and Electrical Properties Decoupled by Localized Phonon Resonances. *Advanced Materials* (2023) doi: 10.1002/adma.202209779; Hussein, M. I., Tsai, C. N. & Honarvar, H. Thermal Conductivity Reduction in a Nanophononic Metamaterial versus a Nanophononic Crystal: A Review and Comparative Analysis. *Adv Funct Mater* 30, (2020); Cucciniello, N. et al. Superconducting niobium nitride: A perspective from processing, microstructure, and superconducting property for single photon detectors. *Journal of Physics Condensed Matter* 34, (2022); Esmaeil Zadeh, I. et al. Superconducting nanowire single-photon detectors: A perspective on evolution, state-of-the-art, future developments, and applications. *Appl Phys Lett* 118, (2021); Natarajan, C. M., Tanner, M. G. & Hadfield, R. H. Superconducting nanowire single-photon detectors: physics and applications. *ArXiv* (2012); Eom, B. H., Day, P. K., Leduc, H. G. & Zmuidzinas, J. A Wideband, Low-Noise Superconducting Amplifier with High Dynamic Range. *Nat Phys* (2012); Capelle, K. A bird's-eye view of density-functional theory. (2002) doi: 10.1590/S0103-97332006000700035; Nomura, Y. & Akashi, R. Density functional theory. *ArXiv* (2022); Giustino, F. Electron-phonon interactions from first principles. *Rev Mod Phys* 89, 1-63 (2017); You, L. Superconducting nanowire single-photon detectors for quantum information. *Nanophotonics* 9, 2673-2692 (2020); Morozov, D. V., Casaburi, A. & Hadfield, R. H. Superconducting photon detectors. *Contemp Phys* 62, 69-91 (2021); Pickett, W. E. Room temperature superconductivity: The roles of theory and materials design. *Rev Mod Phys* 95, 021001 (2023); Vasileiadis, T. et al. Progress and perspectives on phononic crystals. *Journal of Applied Physics* vol. 129 160901 Preprint at https://doi.org/10.1063/5.0042337 (2021); Wei, X. et al. Ultrathin epitaxial NbN superconducting films with high upper critical field grown at low temperature. *Mater Res Lett* 9, 336-342 (2021); Korzh, B. A. et al. Demonstrating sub-3 ps temporal resolution in a superconducting nanowire single-photon detector. *Nat Photonics* 14, 1-6 (2020); Dane, A. et al. Self-heating hotspots in superconducting nanowires cooled by phonon black-body radiation. *Nat Commun* 13, (2022); Nieto, S. J. R., Hofer, J. A., Sirena, M. & Haberkorn, N. Flexible NbTiN thin films for superconducting electronics. *Physica C: Superconductivity and its Applications* 607, 1354241 (2023); Zichi, J. et al. Optimizing the stoichiometry of ultrathin NbTiN films for high-performance superconducting nanowire single-photon detectors. *Opt Express* 27, 26579 (2019); Cybercy, M. et al. NbTiN/AlN/NbTiN SIS junctions realized by reactive bias target ion beam deposition. *IEEE Transactions on Applied Superconductivity* 29, 1100306 (2019); Chen, A. B. & Sher, A. *Semiconductor alloys: physics and materials engineering.* (Springer Science & Business Media, 1995); Sher, A., van Schilfgaarde, M., Chen, A.-B. & Chen, W. Quasichemical approximation in binary alloys. *Phys Rev B* 36, 4279 (1987); Pickard, C. J. Ephemeral data derived potentials for random structure search. *Phys Rev B* 106, 014102 (2022); Carbotte, J. P., Schachinger, E. & Basov, D. N. Coupling strength of charge carriers to spin fluctuations in high-temperature superconductors. *Nature* 401, 354-356 (1999); Semenov, A. D. Superconducting nanostrip single-photon detectors some fundamental aspects in detection mechanism, technology and performance. *Supercond Sci Technol* 34, (2021); Lita, A. E., Reddy, D. V., Verma, V. B., Mirin, R. P. & Nam, S. W. Development of Superconducting Single-Photon and Photon-Number Resolving Detectors for Quantum Applications. *Journal of Lightwave Technology* 40, 7578-7597 (2022); Charaev, I. et al. Single-photon detection using high-temperature superconductors. *Nat Nanotechnol* (2023) doi: 10.1038/s41565-023-01325-2; Kim, C. et al. Wafer-scale magnesium diboride thin films and devices with tunable high kinetic inductance. *ArXiv* (2023); Allmaras, J. P. Modeling and Development of Superconducting Nanowire Single-Photon Detectors. (2020); Sunter, K. A. & Berggren, K. K. Optical modeling of superconducting nanowire single photon detectors using the transfer matrix method. *Appl Opt* 57, 4872 (2018); Csete, M. et al. Improvement of infrared single-photon detectors absorptance by integrated plasmonic structures. *Sci Rep* 3, 2406 (2013); Anant, V. et al. Optical properties of superconducting nanowire single-photon detectors. *Opt Express* 16, 10750 (2008); Protte, M. et al. Laser-lithographically written micron-wide superconducting nanowire single-photon detectors. *Supercond Sci Technol* 35, (2022); Ejrnaes, M. et al. Single photon detection in NbRe superconducting microstrips. *Appl Phys Lett* 121, (2022); Engel, A., Renema, J. J., Il'In, K. & Semenov, A. Detection mechanism of superconducting nanowire single-photon detectors. *Supercond Sci Technol* 28, (2015); Vodolazov, D. Yu. Minimal timing jitter in superconducting nanowire single photon detectors. *Phys Rev Appl* (2019) doi: 10.1103/PhysRevApplied. 11.014016; Engel, A. & Schilling, A. Numerical analysis of detection-mechanism models of SNSPD. (2013) doi: 10.1063/1.4836878; Vodolazov, D. Yu. Theory of single photon detection by 'dirty' current-carrying superconducting strip based on the kinetic equation approach. *Phys Rev Appl* (2017) doi: 10.1103/PhysRevApplied.7.034014; Frasca, S. et al. Determining the depairing current in superconducting nanowire single-photon detectors. *Phys Rev B* 100, 054520 (2019); Davis, B. L. & Hussein, M. I. Nanophononic metamaterial: Thermal conductivity reduction by local resonance. *Phys Rev Lett* 112, (2014); and Yang, J. K. W. et al. Modeling the electrical and thermal response of superconducting nanowire single-photon detectors. in *IEEE Transactions on Applied Superconductivity* vol. 17 581-585 (2007).

The embodiments of the systems and methods provided within this disclosure are not intended to limit the scope of the disclosure but are merely representative of possible embodiments. In addition, the steps of a method, modeling, or simulation approach do not necessarily need to be executed. If the steps of a method, modeling, or simulation approach are executed, they do not necessarily need to be executed in any specific order, or even sequentially, nor do the steps need to be executed only once. In some instances, well-known structures, materials, or operations are not shown or described in detail to avoid obscuring aspects of this disclosure. This disclosure is to be regarded in an illustrative rather than a restrictive sense and includes and encompasses at least the following claims.

What is claimed is:

1. A single-photon detector, comprising:

a nanowire of a superconductor metamaterial comprising a plurality of superconductor nanophononic crystal (SC-NPC) nanostructures of a superconductor material, wherein each SC-NPC nanostructure comprises a three-dimensional lattice of the superconductor material with a nanohole formed therein to increase electron-phonon coupling for a phonon mode of the superconductor material;

a cooling system to cool the nanowire to an operating temperature that is less than a superconducting critical temperature ($T_c$) of the superconductor metamaterial;

a bias circuit to bias the nanowire with a bias current that is:

below a superconducting critical current ($J_c$) of the superconductor metamaterial, and above a local, reduced superconducting critical current exhibited by the superconductor metamaterial in a localized region of the nanowire in response to an incident photon, such that an incident photon forms a localized non-superconducting region in the nanowire; and a detection circuit connected to the nanowire, the detection circuit configured to receive bias current from the bias circuit in response to an incident photon forming a localized non-superconducting region in the nanowire.

2. The single-photon detector of claim 1, wherein the superconducting critical temperature ($T_c$) of the superconductor metamaterial is at least 3 kelvin higher than a superconducting critical temperature of a thin-film or bulk form of the superconducting material.

3. The single-photon detector of claim 1, wherein dimensions of each SC-NPC nanostructure are selected to amplify the phonon modes of the superconductor material that have the strongest electron-phonon coupling.

4. The single-photon detector of claim 1, wherein dimensions of each SC-NPC nanostructure are selected to amplify at least one phonon mode of the superconductor material.

5. The single-photon detector of claim 1, wherein dimensions of each SC-NPC nanostructure are selected to reduce a frequency associated with at least one phonon mode, and wherein the dimensions of each SC-NPC nanostructure are selected to reduce the frequencies associated with the phonon mode by between 1 THz and 3 THz.

6. The single-photon detector of claim 1, wherein dimensions of each SC-NPC nanostructure are selected to reduce frequencies associated with at least one phonon mode of the superconducting material, and wherein the dimensions of each SC-NPC nanostructure are selected to reduce the frequencies associated with each of the at least one phonon mode by at least 1 THz.

7. The single-photon detector of claim 1, wherein the superconductor material comprises at least one of: niobium disulfide ($NbS_2$), titanium nitride (TiN), niobium nitride (NbN), niobium-titanium nitride (NbTiN), magnesium diboride ($MgB_2$), niobium carbine (NbC), niobium diselenide ($NbSe_2$).

8. The single-photon detector of claim 1, wherein each SC-NPC nanostructure comprises a rectangular cubic crystal with a length of X asymmetric units of the superconductor material, a width of Y asymmetric units of the superconductor material, and a thickness of Z asymmetric units of the superconductor material, where each of X, Y, and Z is an integer value.

9. A superconductor device, comprising:

a superconductor metamaterial comprising a plurality of superconductor nanophononic crystal (SC-NPC) nanostructures of a superconductor material, wherein each SC-NPC nanostructure is formed as a rectangular cubic crystal with a nanohole formed therein, wherein dimensions of the rectangular cubic crystal and nanohole of each SC-NPC nanostructure are selected to modify a characteristic of at least one phonon mode of the superconductor material to alter at least one superconducting parameter of the superconductor metamaterial relative to a bulk form of the superconducting material.

10. The superconductor device of claim 9, wherein the rectangular cubic crystal of each SC-NPC nanostructure has a length of X asymmetric units of the superconductor material, a width of Y asymmetric units of the superconductor material, and a thickness of Z asymmetric units of the superconductor material, where each of X, Y, and Z is is a positive integer, and wherein the nanohole of each SC-NPC nanostructure has a length of A asymmetric units of the superconductor material, a width of B asymmetric units of the superconductor material, and a thickness of C asymmetric units of the superconductor material, where each of A, B, and C is a positive integer with $A \leq (X-2)$, $B=(Y-2)$, and $C=Z$.

11. The superconductor device of claim 9, wherein the nanohole of each SC-NPC nanostructure is filled with a second superconductor material.

12. A quantum-engineered superconductor metamaterial device, comprising:

a superconductor metamaterial comprising a plurality of superconductor nanophononic crystal (SC-NPC) nanostructures of a superconductor material, wherein each SC-NPC nanostructure comprises:

a crystal of the superconductor material, and a structural modification to the crystal that alters a characteristic of a phonon mode of the superconductor material to enhance a superconducting parameter thereof.

13. The device of claim 12, further comprising a cooling system to maintain a temperature below a superconducting critical temperature ($T_c$) of the superconductor metamaterial.

14. The device of claim 12, wherein the superconducting parameter comprises a critical temperature ($T_c$) of the superconducting material, and wherein the critical temperature of the superconducting metamaterial is higher than a critical temperature of a bulk form of the superconducting material.

15. The device of claim 12, wherein the superconducting parameter comprises an energy gap (A) of the superconducting material.

16. The device of claim 12, wherein the structural modification to the crystal of each SC-NPC nanostructure operates to amplify the phonon mode of the superconductor material that has the strongest electron-phonon coupling.

17. The device of claim 12, wherein the structural modification to the crystal of each SC-NPC nanostructure operates to shift frequencies associated with at least one phonon mode of the superconducting material.

18. The device of claim 12, wherein the superconductor material comprises niobium disulfide ($NbS_2$), titanium nitride (TiN), niobium nitride (NbN), niobium-titanium nitride (NbTiN), magnesium diboride ($MgB_2$), niobium carbine (NbC), niobium diselenide ($NbSe_2$).

19. The device of claim 12, wherein the superconductor material comprises a conventional superconductor material.

20. The device of claim 12, wherein the structural modification to the crystal of each SC-NPC nanostructure comprises a nanohole formed within the crystal.

21. The device of claim 20, wherein the nanohole of each SC-NPC nanostructure is filled with a second superconductor material.

22. The device of claim 12, wherein the crystal of each SC-NPC nanostructure has a length of X asymmetric units of the superconductor material, a width of Y asymmetric units of the superconductor material, and a thickness of Z asymmetric units of the superconductor material, where each of X, Y, and Z is a positive integer.

23. The device of claim 22, wherein the structural modification of each nanophononic crystal comprises a stub formation of asymmetric units of the superconductor material that extends from one surface of the crystal, wherein the stub formation of asymmetric units of each nanophononic crystal is a rectangular stub formation with a length of A asymmetric units of the superconductor material, a width of B asymmetric units of the superconductor material, and a thickness of C asymmetric units of the superconductor material, where each of A, B, and C is an integer value with $A \leq (X-2)$, $B \leq (Y-2)$, and $C \geq 1$.

24. The device of claim 22, wherein the structural modification to the crystal of each SC-NPC nanostructure comprises:

a rectangular nanohole with a length of A asymmetric units of the superconductor material, a width of B asymmetric units of the superconductor material, and a thickness of C asymmetric units of the superconductor material, where each of A, B, and C is a positive integer with $A \leq (X-2)$, $B=(Y-2)$, and $C \leq (Z-2)$.

25. The device of claim 12, wherein the superconductor metamaterial comprises of at least one superconducting layer and at least one non-superconducting layer, and wherein at least one of the layers is twisted with respect to the other.

26. The device of claim 12, wherein the superconductor metamaterial is formed as a layer between a first twisted layer and a second twisted layer, and wherein at least one of the first twisted layer and the second twisted layer comprises a superconductor material.

27. The device of claim 12, wherein the superconductor metamaterial is formed by the twisting of a first layer and a second layer, and wherein at least one of the first twisted layer and the second twisted layer comprises a superconductor material.

28. The device of claim 12, wherein the structural modification to the crystal of each SC-NPC nanostructure enhances a kinetic inductance ($L_k$) of the superconductor metamaterial, relative to a bulk form of the superconducting material.

29. The device of claim 12, wherein the structural modification to the crystal of each SC-NPC nanostructure operates to decrease a normal state resistivity of the superconductor metamaterial, relative to a bulk form of the superconducting material.

30. The device of claim 12, wherein the structural modification to the crystal of each SC-NPC nanostructure operates to increase a normal state resistivity of the superconductor metamaterial, relative to a bulk form of the superconducting material.

31. The device of claim 12, wherein the structural modification to the crystal of each SC-NPC nanostructure operates to increase a critical temperature ($T_c$) of the superconductor metamaterial, relative to a bulk form of the superconducting material.

32. The device of claim 12, wherein the structural modification to the crystal of each SC-NPC nanostructure operates to decrease a critical pressure of the superconductor metamaterial, relative to a bulk form of the superconducting material.

33. The device of claim 12, wherein the superconductor material is used in a superconducting nanowire single-photon detector (SNSPD), and wherein the superconductor metamaterial operates to decrease a device recovery time of the SNSPD, relative to a bulk form of the superconducting material.

34. The device of claim 12, wherein the superconductor metamaterial is used in a superconducting nanowire single-photon detector (SNSPD), and wherein the superconductor metamaterial operates to modify a coherence time of the SNSPD, relative to a bulk form of the superconducting material.

35. The device of claim 12, wherein the superconductor material is used in a superconducting nanowire single-photon detector (SNSPD), and wherein the superconductor metamaterial operates to increase a thermal conductivity normal to an interface between the superconductor metamaterial and a dielectric substrate, relative to a bulk form of the superconducting material.

* * * * *